(12) United States Patent
Shinohara et al.

(10) Patent No.: US 8,754,441 B2
(45) Date of Patent: Jun. 17, 2014

(54) SEMICONDUCTOR LIGHT-EMITTING DEVICE WITH A CONCAVO-CONVEX PART FORMED ON A P-TYPE SEMICONDUCTOR LAYER AND METHOD FOR MANUFACTURING SEMICONDUCTOR LIGHT-EMITTING DEVICE

(75) Inventors: Hironao Shinohara, Ichihara (JP); Hiromitsu Sakai, Chiba (JP)

(73) Assignee: Toyoda Gosei Co., Ltd., Aichi (JP)

( * ) Notice: Subject to any disclaimer, the term of this patent is extended or adjusted under 35 U.S.C. 154(b) by 162 days.

(21) Appl. No.: 13/124,918

(22) PCT Filed: Oct. 16, 2009

(86) PCT No.: PCT/JP2009/005420
§ 371 (c)(1),
(2), (4) Date: Apr. 19, 2011

(87) PCT Pub. No.: WO2010/047072
PCT Pub. Date: Apr. 29, 2010

(65) Prior Publication Data
US 2011/0198567 A1 Aug. 18, 2011

(30) Foreign Application Priority Data
Oct. 20, 2008 (JP) .................................. 2008-269788

(51) Int. Cl.
*H01L 33/00* (2010.01)
(52) U.S. Cl.
USPC ...................... 257/101; 257/98; 257/E33.074

(58) Field of Classification Search
USPC .................................................. 257/13, 103
See application file for complete search history.

(56) References Cited

U.S. PATENT DOCUMENTS

| 2005/0212002 A1 | 9/2005 | Sanga et al. |
| 2010/0230714 A1* | 9/2010 | Shinohara et al. ............ 257/103 |

FOREIGN PATENT DOCUMENTS

| JP | 06-291368 A | 10/1994 |
| JP | 2003-347586 A | 12/2003 |
| JP | 2005-317931 A | 11/2005 |
| JP | 2006-128227 A | 5/2006 |
| JP | 2007-258446 A | * 10/2007 |
| JP | 2007-300134 A | 11/2007 |

* cited by examiner

*Primary Examiner* — Eva Yan Montalvo
(74) *Attorney, Agent, or Firm* — Sughrue Mion, PLLC

(57) ABSTRACT

The semiconductor light-emitting device (11) of the present invention includes a substrate (1); a laminate semiconductor layer (15) comprised of an n-type semiconductor layer (3) formed on the substrate (1), a light-emitting layer (4) laminated on the n-type semiconductor layer (3) and a p-type semiconductor layer (5) laminated on the light-emitting layer (4); a concavo-convex part (33) for improving a light extraction efficiency, which is formed on all or a part of a top surface (15a) of the laminate semiconductor layer (15); a high-concentration p-type semiconductor layer (8) having a higher dopant concentration than that of the p-type semiconductor layer (5), which is laminated on a convex part (33a) that constitutes the concavo-convex part (33) of the laminate semiconductor layer (15); and a translucent current diffusion layer (20) laminated on at least the high-concentration p-type semiconductor layer (8).

6 Claims, 9 Drawing Sheets

SEMICONDUCTOR LIGHT-EMITTING DEVICE WITH A CONCAVO-CONVEX PART FORMED ON A P-TYPE SEMICONDUCTOR LAYER AND METHOD FOR MANUFACTURING SEMICONDUCTOR LIGHT-EMITTING DEVICE

TECHNICAL FIELD

The present invention relates to a semiconductor light-emitting device and a method for manufacturing the semiconductor light-emitting device. More particularly, the present invention relates to a semiconductor light-emitting device in which a concavo-convex part is formed on a light extraction surface, and a method for manufacturing the semiconductor light-emitting device.

Priority is claimed on Japanese Patent Application No. 2008-269788, filed Oct. 20, 2008, the content of which is incorporated herein by reference.

BACKGROUND ART

In recent years, GaN-based compound semiconductor materials, that is a nitride-based semiconductor, have become of interest as a semiconductor material for a light-emitting device that emits light of short wavelength. The GaN-based compound semiconductor is formed on a substrate of a sapphire single crystal, various oxides or a Group III-V compound through a metal-organic chemical vapor deposition method (MOCVD method), a molecular-beam epitaxy method (MBE method) or the like.

A GaN-based compound semiconductor material has a characteristic such as less diffusion of a current in a transverse direction. Therefore, the current is injected only into a semiconductor directly under an electrode, and light emitted in a light-emitting layer is not extracted to the outside because of being blocked off by the electrode. Therefore, in such a light-emitting device, a translucent positive electrode is usually used and light is extracted through the translucent positive electrode.

A conventional translucent positive electrode has a layer structure in which oxide of Ni, Co or the like is used in combination with a contact metal such as Au. There has recently been employed, as a positive electrode, a layer structure having translucency enhanced by thinning a film thickness of the contact metal as small as possible using an oxide having higher conductivity such as ITO, and thus light from a light-emitting layer can be efficiently extracted to the outside.

External quantum efficiency is used as an indicator for improving an output of such a light-emitting device. It can be said that a light-emitting device with high external quantum efficiency has a high output.

The external quantum efficiency is represented as a product obtained by multiplying internal quantum efficiency by light extraction efficiency.

The internal quantum efficiency is the percentage of energy that is converted into light among energy of a current injected into a device. On the other hand, the light extraction efficiency is the percentage of light that can be extracted to the outside among light generated in the inside of a semiconductor crystal.

It is considered that above-mentioned internal quantum efficiency of the light-emitting device is improved up to about 70 to 80% by an improvement of a crystal state and investigation of a structure, and a sufficient effect is obtained in the amount of injection current.

However, in not only a GaN-based compound semiconductor but also a light emitting diode (LED), light extraction efficiency to the injection current is generally low and it is difficult to say that internal emission to injection current is sufficiently extracted to the outside.

The reason why the light extraction efficiency is low is that reflection and absorption are repeated in a crystal and light cannot be extracted to the outside since a light-emitting layer in a GaN-based compound semiconductor has a very high refractive index of about 2.5 as compared air having a refractive index of 1 and a critical angle is small as about 25°.

In order to improve the light extraction efficiency of a light-emitting device, there have been proposed those in which light extraction efficiency is improved by roughening a light extraction surface and providing various angles on the light extraction surface.

For example, Patent Literature 1 discloses a gallium nitride-based compound semiconductor light-emitting device in which a surface of a top layer of a gallium nitride-based compound semiconductor is converted into a non-specular surface through etching or the like.

Patent Literature 2 discloses a nitride semiconductor light-emitting device in which concavo-convex is formed on a surface of ITO.

However, in the light-emitting devices described in Patent Literatures 1 or 2, there was a problem that a driving voltage extremely increases due to etching damage when surface (light extraction surface) or the like of a top layer of the semiconductor is roughened through etching.

Patent Literature 3 discloses a light-emitting device in which a surface of a p-type GaN layer is processed into a concavo-convex surface through etching and, furthermore, metal such as Mg is added in a high concentration on the entire surface of the concavo-convex surface.

In Patent Literature 3, for example, the p-type GaN layer is etched using, as a mask, a resist layer having a stripe shape formed by pattern processing using a known photolithography method or the like to form a roughened surface made of a concavo-convex surface, and then an Mg layer is laminated on the concavo-convex surface and also the Mg layer is annealed, thereby diffusing Mg and further adding Mg to a surface side of the p-type GaN layer.

However, regarding the light-emitting device disclosed in Patent Literature 3, Mg is added to the entire surface of the p-type GaN layer. Therefore, in case a voltage is applied to a transparent electrode on the p-type GaN layer through a bonding pad, a current is not diffused on the entire surface of the transparent electrode and the current is concentrated on a semiconductor layer directly under the bonding pad, and thus luminous efficiency of the light-emitting device could not sometimes be improved.

CITATION LIST

Patent Literature

[Patent Literature 1]
Japanese Unexamined Patent Application, First Publication No. Hei 6-291368
[Patent Literature 2]
Japanese Unexamined Patent Application, First Publication No. 2006-128227
[Patent Literature 3]
Japanese Unexamined Patent Application, First Publication No. 2003-347586

SUMMARY OF INVENTION

Technical Problem

Under these circumstances, the present invention has been made, and an object thereof is to provide a semiconductor light-emitting device that is excellent in light extraction efficiency and is also operatable in a low driving voltage, and a method for manufacturing the same.

Solution to Problem (1) A semiconductor light-emitting device comprising:
a substrate;
a laminate semiconductor layer comprised of an n-type semiconductor layer formed on the substrate, a light-emitting layer laminated on the n-type semiconductor layer and a p-type semiconductor layer laminated on the light-emitting layer;
a concavo-convex part for improving a light extraction efficiency, which is formed on all or a part of a top surface of the laminate semiconductor layer;
a high-concentration p-type semiconductor layer having a higher dopant concentration than that of the p-type semiconductor layer, which is laminated on a convex part that constitutes the concavo-convex part of the laminate semiconductor layer; and
a translucent current diffusion layer laminated on at least the high-concentration p-type semiconductor layer.
(2) The semiconductor light-emitting device according to (1), wherein the high-concentration p-type semiconductor layer has a thickness of 50 nm or less.
(3) The semiconductor light-emitting device according to (1) or (2), wherein a concave part, that constitutes the concavo-convex part of the laminate semiconductor layer, reaches the inside of the p-type semiconductor layer, and
the p-type semiconductor layer in the concave part is formed with a low-concentration p-type semiconductor region having a lower dopant concentration than that of the p-type semiconductor layer.
(4) The semiconductor light-emitting device according to any one of (1) to (3), wherein the translucent current diffusion layer is laminated on the entire surface of the concavo-convex part.
(5) The semiconductor light-emitting device according to (1) or (2), wherein a concave part, that constitutes the concavo-convex part of the laminate semiconductor layer, passes through the p-type semiconductor layer and the light-emitting layer to reach the inside of the n-type semiconductor layer, and
the p-type semiconductor layer in the concave part is formed with a low-concentration p-type semiconductor region having a lower dopant concentration than that of the p-type semiconductor layer.
(6) The semiconductor light-emitting device according to any one of (1) to (5), wherein the p-type semiconductor layer, the high-concentration p-type semiconductor layer and the low-concentration p-type semiconductor region are constituted from a gallium nitride-based semiconductor, and a dopant contained therein is Mg,
the dopant concentration of the p-type semiconductor layer is within a range of $1\times10^{19}/cm^3$ or more and less than $1\times10^{20}/cm^3$,
the dopant concentration of the high-concentration p-type semiconductor layer is $1\times10^{20}/cm^3$ or more, and
the dopant concentration of the low-concentration p-type semiconductor region is less than $1\times10^{19}/cm^3$.
(7) A method for manufacturing a semiconductor light-emitting device, which comprises a step of forming a laminate semiconductor layer comprised of an n-type semiconductor layer, a light-emitting layer and a p-type semiconductor layer on a substrate, and laminating a high-concentration p-type semiconductor layer having a higher dopant concentration than that of the p-type semiconductor layer on the p-type semiconductor layer to form a laminate; and
a light extraction part formation step of forming the concavo-convex part on all or a part of a top surface of the laminate, and forming a translucent current diffusion layer on at least a convex part that constitutes the concavo-convex part.
(8) The method for manufacturing a semiconductor light-emitting device according to (7), wherein the light extraction part formation step comprises a step of forming the translucent current diffusion layer on the high-concentration p-type semiconductor layer, and a step of forming a concave part that passes through the translucent current diffusion layer to reach the laminate through etching.
(9) The method for manufacturing a semiconductor light-emitting device according to (7), wherein the light extraction part formation step includes a step of forming a concave part on the laminate through etching, and a step of forming the translucent current diffusion layer on a top surface of the laminate.
(10) The method for manufacturing a semiconductor light-emitting device according to (8) or (9), wherein a concave part is formed on at least the p-type semiconductor layer by forming a concave part on the laminate and, at the same time, a low-concentration p-type semiconductor region having a lower dopant concentration than that of the p-type semiconductor layer in the concave part.
(11) The method for manufacturing a semiconductor light-emitting device according to any one of (7) to (10), wherein a concave part, that constitutes the concavo-convex part, is formed so as to reach the inside of the p-type semiconductor layer
(12) The method for manufacturing a semiconductor light-emitting device according to (11), wherein the translucent current diffusion layer is laminated on the entire surface of a top surface of the laminate.
(13) The method for manufacturing a semiconductor light-emitting device according to any one of (7), (8) and (10), wherein the concave part is formed so that it passes through the p-type semiconductor layer and the light-emitting layer to reach the inside of the n-type semiconductor layer.
(14) The method for manufacturing a semiconductor light-emitting device according to any one of (8) to (13), wherein the concave part is formed through a dry etching method.
(15) The method for manufacturing a semiconductor light-emitting device according to (14), wherein an etching mask used in the dry etching method is formed through any one of a nanoimprinting method, an EB exposure method and a laser exposure method.

Advantageous Effects of Invention

According to the above constitution, it is possible to provide a semiconductor light-emitting device that is excellent in light extraction efficiency and is also operable at a low driving voltage, and a method for manufacturing the same.

DESCRIPTION OF EMBODIMENTS

Mode for carrying out the present invention will be described below. However, the present invention is not limited to each of the following embodiments and, for example, constituent elements of these embodiments may be appropriately combined with each other.

First Embodiment

<Semiconductor Light-Emitting Device>

Figure 1A:
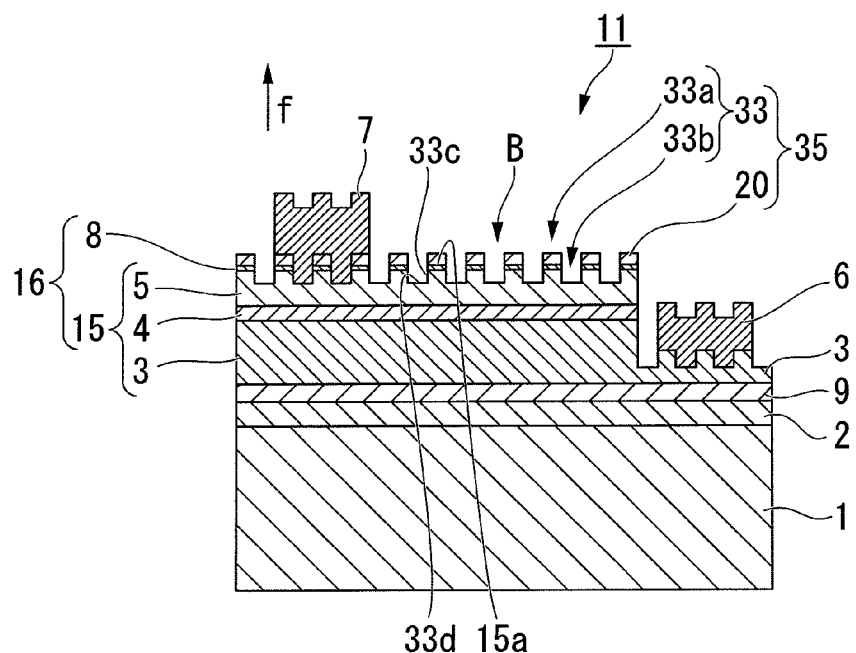
FIG. 1a is a planar diagram of a semiconductor light-emitting device as the first embodiment of the present invention.
Figure 1B:
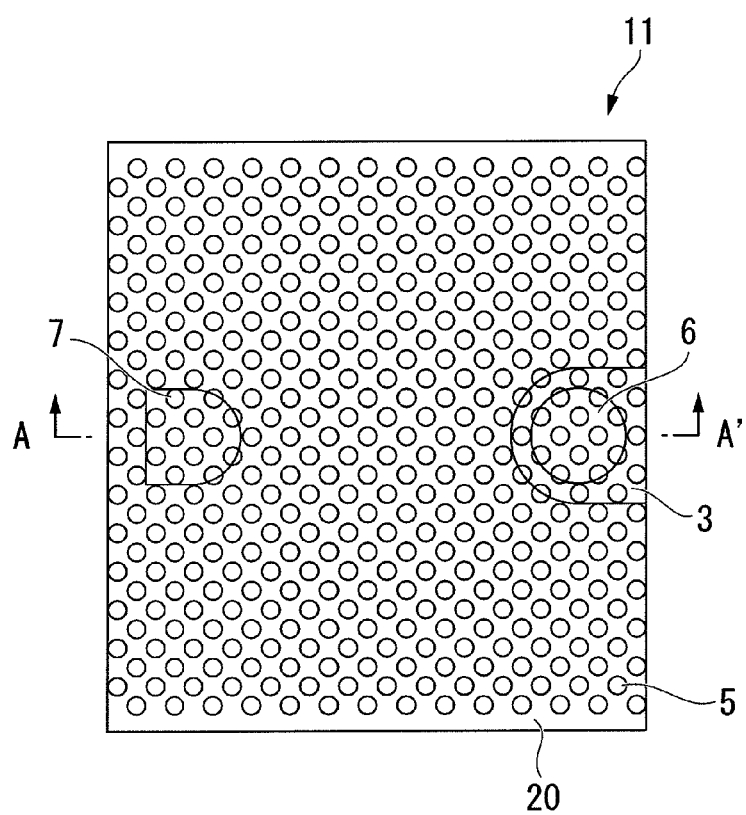
FIG. 1b is a cross-sectional diagram of a semiconductor light-emitting device as the first embodiment of the present invention.
Figure 2:
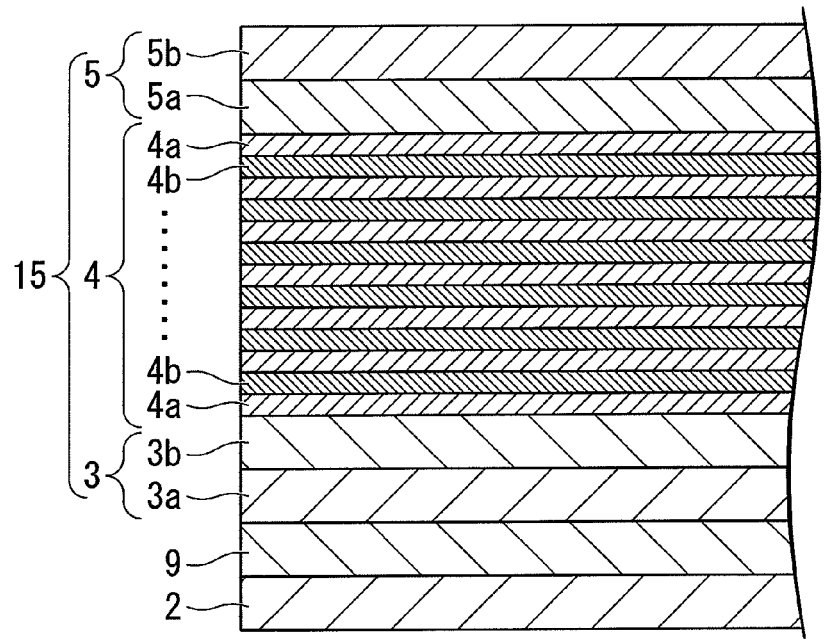
FIG. 2 is an enlarged cross-sectional diagram of a laminate semiconductor layer of a semiconductor light-emitting device shown in FIG. 1a and FIG. 1b.

FIG. 1a and FIG. 1b are schematic diagrams showing an example of a semiconductor light-emitting device as the first embodiment of the present invention, in which FIG. 1a is a planar diagram and FIG. 1b is a cross-sectional diagram taken along lines A-A' of FIG. 1a. FIG. 2 is an enlarged cross-sectional diagram showing from a buffer layer 2 to a laminate semiconductor layer 15.

As shown in FIG. 1b, a semiconductor light-emitting device 11 as the embodiment of the present invention is schematically constituted from a substrate 1, a buffer layer 2 laminated on the substrate, an n-type semiconductor layer 3 laminated on the buffer layer 2, a light-emitting layer 4 laminated on the n-type semiconductor layer 3, a p-type semiconductor layer 5 laminated on the light-emitting layer 4, a high-concentration p-type semiconductor layer 8 laminated on the p-type semiconductor layer 5, a translucent current diffusion layer 20 laminated on the high-concentration p-type semiconductor layer 8, a bonding pad 7 of a positive electrode, and a bonding pad 6 of a negative electrode.

The n-type semiconductor layer 3, the light-emitting layer 4 and the p-type semiconductor layer 5 are sequentially laminated to form a laminate semiconductor layer 15. On a top surface 15a of the laminate semiconductor layer 15, a concavo-convex part 33 is formed. On a convex part 33a that constitutes this concavo-convex part 33, the high-concentration p-type semiconductor layer 8 and the translucent current diffusion layer 20 are laminated in this order. The high-concentration p-type semiconductor layer 8 is formed on the laminate semiconductor layer 15 to form a laminate 16.

The semiconductor light-emitting device 11 as the embodiment of the present invention will be sequentially described every constituent element.

<Substrate>

It is possible to use, as the material of the substrate 1, well-known substrate materials, for example, an oxide single crystal such as a sapphire single crystal ($Al_2O_3$; A-plane, C-plane, M-plane, R-plane), a spinel single crystal ($MgAl_2O_4$), a ZnO single crystal, $LiAlO_2$ single crystal, a $LiGaO_2$ single crystal or a MgO single crystal; a Si single crystal; a SiC single crystal; a GaAs single crystal; AlN single crystal; GaN single crystal; and a boride single crystal such as $ZrB_2$; without any limitation. Among these substrate materials, a sapphire single crystal and a SiC single crystal are particularly preferable. There is no particular limitation on the plane direction of the substrate 1. The substrate may be either a just substrate, or a substrate with an off-angle.

<Buffer Layer>

A buffer layer 2 is a layer that relaxes a difference in a lattice constant between the substrate 1 and the n-type semiconductor layer 3 to form an n-type semiconductor layer 3 having high crystallinity. The buffer layer 2 may be sometimes unnecessary depending on the substrate to be used and the growth conditions of an epitaxial layer.

The thickness of the buffer layer 2 is set, for example, within a range from 0.01 to 0.5 μm. Thereby, the effect of relaxing the difference in a lattice constant can be sufficiently obtained and also productivity can be improved.

The buffer layer 2 is made of a Group III nitride semiconductor and is preferably made of a polycrystalline $Al_xGa_{1-x}N$ ($0 \le x \le 1$) or a monocrystalline $Al_xGa_{1-x}N$ ($0 \le x \le 1$). Thereby, the difference in a lattice constant between the substrate 1 and the n-type semiconductor layer 3 can be relaxed and also an n-type semiconductor layer 3 having high crystallinity can be formed.

The buffer layer 2 can be formed through a MOCVD method or may be formed through a sputtering method. In case the buffer layer 2 is formed through the sputtering method, it is possible to suppress the temperature of the substrate 1 at the time of the formation of the buffer layer 2 to a low temperature. Therefore, even in case of using the substrate 1 made of a material having a property capable of decomposing at a high temperature, it becomes possible to form each layer on the substrate 1 without damaging the substrate 1, and it is preferable.

<Laminate Semiconductor Layer>

On a substrate 1, a ground layer 9 made of a gallium nitride-based compound semiconductor, and a laminate semiconductor layer 15 obtained by laminating an n-type semiconductor layer 3, a light-emitting layer 4 and a p-type semiconductor layer 5 are formed through a buffer layer 2.

It is possible to use, as the gallium nitride-based compound semiconductor, a gallium nitride-based compound semiconductor represented, for example, by the general formula: $Al_X Ga_Y In_Z N_{1-A} M_A$ ($0 \leq X \leq 1$, $0 \leq Y \leq 1$, $0 \leq Z \leq 1$ and $X+Y+Z=1$, the reference sign M denotes a Group V element different from nitrogen (N), and $0 \leq A < 1$) without any limitation.

The gallium nitride-based compound semiconductor can contain, in addition to Al, Ga and In, the other Group III element, and also can optionally contain elements such as Ge, Si, Mg, Ca, Zn, Be, P, As and B. Furthermore, the elements are not limited to intentionally added elements and the gallium nitride-based compound semiconductor may sometimes contain impurities that are inevitably contained depending on the film formation conditions and the like, and a trace amount of impurities contained in the raw material and the material of a reaction tube.

There is no particular limitation on the growth method of the gallium nitride-based compound semiconductor, and it is possible to apply all methods, whose ability to grow a nitride semiconductor is known, such as a metal-organic chemical vapor deposition method (MOCVD method), a hydride vapor phase epitaxy method (HVPE method) and a molecular-beam epitaxy method (MBE method). Preferable growth method is a MOCVD method in view of thickness controllability and mass productivity.

In the MOCVD method, hydrogen ($H_2$) or nitrogen ($N_2$) is used as a carrier gas, trimethylgallium (TMG) or triethylgallium (TEG) is used as a Ga source that is a Group III material, trimethylaluminum (TMA) or trimethylaluminum (TEA) is used as an Al source, trimethylindium (TMI) or triethylindium (TED is used as an In source, and ammonia ($NH_3$), hydrazine ($N_2H_4$) or the like is used as an N source that is a Group V material Monosilane ($SiH_4$) or disilane ($Si_2H_6$) can be utilized as an Si material for an n-type dopant, and a germane gas ($GeH_4$) and organogermanium compounds such as tetramethyl germanium (($CH_3$)$_4$Ge) and tetraethyl germanium (($C_2H_5$)$_4$Ge) can be utilized as a Ge material.

In the MBE method, elemental germanium can also be utilized as a doping source. For a p-type dopant, for example, bis(cyclopentadienyl)magnesium ($Cp_2Mg$) or bisethylcyclopentadienylmagnesium ($EtCp_2Mg$) is used as an Mg material.

<Ground Layer>

A ground layer 9 is laminated on a buffer layer 2 and is preferably constituted from an $Al_X Ga_{1-X}N$ layer ($0 \leq x \leq 1$, preferably $0 \leq x \leq 0.5$, and more preferably $0 \leq x \leq 0.1$). The thickness of the ground layer 9 is preferably 0.1 μm or more, more preferably 0.5 μm or more, and most preferably 1 μm or more. By controlling the thickness to 1 μm or more, it becomes easy to obtain an $Al_X Ga_{1-X}N$ layer having satisfactory crystallinity.

The ground layer 9 may be doped with n-type impurities as long as the concentration is within a range from $1 \times 10^{17}$ to $1 \times 10^{19}$/cm$^3$, but is preferably undoped ($<1 \times 10^{17}$/cm$^3$) from the viewpoint of maintaining satisfactory crystallinity. Examples of n-type impurities include, but are not limited to, Si, Ge and Sn. Among these impurities, Si and Ge are preferable.

The growth temperature in case of growing the ground layer 9 is preferably controlled within a range from 800 to 1,200° C., and more preferably from 1,000 to 1,200° C. When the ground layer is grown within the above temperature range, a ground layer having satisfactory crystallinity is obtained. The pressure in a MOCVD growth furnace is preferably controlled within a range from 15 to 40 kPa.

<n-type Semiconductor Layer>

As shown in FIG. 2, an n-type semiconductor layer 3 is constituted by sequentially laminating an n-type contact layer 3a and an n-type clad layer 3b on a ground layer 9. The n-type contact layer 3a can also function as the ground layer and/or the n-type clad layer 3b.

The n-type contact layer 3a is preferably constituted by $Al_X Ga_{1-X}N$ layer ($0 \leq x \leq 1$, preferably $0 \leq x \leq 0.5$, and more preferably $0 \leq x \leq 0.1$) similarly to the ground layer 9.

It is also preferred to be doped with n-type impurities. When n-type impurities are contained in the concentration of $1 \times 10^{17}$ to $1 \times 10^{19}$/cm$^3$, and preferably $1 \times 10^{18}$ to $1 \times 10^{19}$/cm$^3$, it is preferred in view of maintaining of satisfactory ohmic contact with a negative electrode, prevention of the occurrence of cracks, and maintaining of satisfactory crystallinity. Examples of n-type impurities include, but are not limited to, Si, Ge and Sn. Among these impurities, Si and Ge are preferable. The growth temperature is the same as that in the ground layer.

The gallium nitride-based compound semiconductor constituting the n-type contact layer 3a preferably has the same composition as that of the ground layer, and the total thickness of these layers is preferably set within a range from 1 to 20 μm, preferably from 2 to 15 μm, and more preferably from 3 to 12 μm. When the total thickness of the n-type contact layer 3a and the ground layer 9 is within the above range, crystallinity of the semiconductor is satisfactorily maintained.

It is preferred to provide an n-type clad layer 3 between the n-type contact layer 3a and the light-emitting layer 4. By providing the n-type clad layer 3b, it is possible to make amends for the position, where surface smoothness became worse, on an outermost surface of the n-type contact layer 3a. The n-type clad layer 3b can be formed of AlGaN, GaN, GaInN and the like. Moreover, the n-type clad layer may also take a superlattice structure obtained by multiple laminations of a heterojunction of these structures. When the n-type clad layer is formed of GaInN, it is needless to say that the band gap is desirably more than that of GaInN of the light-emitting layer 4.

The thickness of the n-type clad layer 3b is not particularly limited and is preferably within a range from 0.005 to 0.5 μm, and more preferably from 0.005 to 0.1 μm.

The n-type dope concentration of the n-type clad layer 3b is preferably within a range from $1 \times 10^{17}$ to $1 \times 10^{20}$/cm$^3$, and more preferably $1 \times 10^{18}$ to $1 \times 10^{19}$/cm$^3$. When the dope concentration is within the above range, satisfactory crystallinity can be maintained and also the operating voltage of the semiconductor light-emitting device can be decreased.

<Light-Emitting Layer>

A light-emitting layer 4 can be formed of a gallium nitride-based compound semiconductor, and preferably formed of a gallium nitride-based compound semiconductor of $Ga_{1-s}In_sN$ ($0<s<0.4$).

As shown in FIG. 2, the light-emitting layer 4 preferably has a multiple quantum well (MQW) structure comprised of the well layer 4b made of $Ga_{1-s}In_sN$, and a barrier layer 4a made of $Al_cGa_{1-c}N$ ($0\leq c<0.3$ and b>c) having a larger bandgap energy than that of the well layer 4b.

There is no particular limitation on the thickness of the well layer 4b, and the thickness is preferably the thickness enough to obtain the quantum effect, for example, a critical thickness within a range from 1 to 10 nm, and more preferably 2 to 6 nm. When the thickness is within the above range, a light emission output can be improved. The well layer 4b and the barrier layer 4a may be doped with impurities.

The structure of the light-emitting layer 4 is not limited to the MQW structure, and may be a single quantum well (SQW) structure.

In the MQW structure, the growth temperature of the $Al_cGa_{1-c}N$ barrier layer 4a is preferably 700° C. or higher. It is more preferred that crystallinity becomes satisfactorily in case of growing at a temperature of 800 to 1,100° C. The growth rate of the GaInN well layer 4b is preferably from 600 to 900° C., and more preferably from 700 to 900° C. That is, in order to make crystallinity of the MQW structure satisfactory, it is preferred to change the growth temperature between layers.

<p-type Semiconductor Layer>

As shown in FIG. 2, a p-type semiconductor layer 5 is constituted by sequentially laminating a p-type clad layer 5a and a p-type contact layer 5b on a light-emitting layer 4. The p-type contact layer 5b can also function as the p-type clad layer 5a.

The material of the p-type semiconductor layer 5 is not particularly limited as long as it is the material with the composition, that has a bandgap energy capable of becoming larger than that of the light-emitting layer 4, and enables confinement of carriers to the light-emitting layer 4. For example, $Al_dGa_{1-d}N$ ($0<d\leq 0.4$, preferably $0.1\leq d\leq 0.3$) is preferable. In case $Al_dGa_{1-d}N$ ($0<d\leq 0.4$, and preferably $0.1\leq d\leq 0.3$) is used as the material of the p-type semiconductor layer 5, it is possible to efficiently confine carries to the light-emitting layer 4.

There is no particular limitation on the p-type semiconductor layer 5, and is preferably 2,000 nm or less, and more preferably 1,000 nm or less.

As the p-type dopant (p-type impurities) of the p-type semiconductor layer 5, for example, Mg can be used. The dopant concentration of the p-type semiconductor layer 5 is preferably controlled within a range of $1\times 10^{19}/cm^3$ or more and less than $1\times 10^{20}/cm^3$. When the dopant concentration is within the above range, a satisfactory p-type crystal can be obtained without causing deterioration of crystallinity.

<Concavo-Convex Part>

As shown in FIG. 1a, a concavo-convex part 33 for improving a light extraction efficiency is formed on a top surface 15a of a laminate semiconductor layer 15. The depth of a concave part 33b constituting the concavo-convex part 33 is the depth that reaches the inside of the p-type semiconductor layer 5.

The depth of the concave part 33b may be the depth that reaches a part of at least p-type semiconductor layer 5.

As shown in FIG. 1b, the concave part 33b has an opening formed of a hole having a circular shape, and a plurality of the concave parts are formed on the entire surface of a top surface 15a of a laminate semiconductor layer 15. At this time, a convex part 33a becomes a top surface 15a part of the laminate semiconductor layer 15 other than the concave part 33b.

The opening of the concave part 33b is not limited to the hole having a circular shape and may be, for example, a hole having a tetragonal shape or a polygonal shape. A top surface of the convex part 33a is preferably a flat surface.

<High-Concentration p-Type Semiconductor Layer>

As shown in FIG. 1a, a high-concentration p-type semiconductor layer 8 having a higher dopant concentration than that of a p-type semiconductor layer 5 is laminated on a top surface 15a of a laminate semiconductor layer 15. Thereby, a laminate 16 comprised of the laminate semiconductor layer 15 and the high-concentration p-type semiconductor layer 8 is formed.

As a p-type dopant (p-type impurities) of the high-concentration p-type semiconductor layer 8, for example, Mg can be exemplified. The dopant concentration of the high-concentration p-type semiconductor layer 8 is preferably controlled to $1\times 10^{20}/cm^3$ or more. As the upper limit of the dopant concentration, $1\times 10^{21}/cm^3$ is exemplified. Thereby, it is possible perform maintaining of a satisfactory ohmic contact, prevention of the occurrence of cracks, and maintaining of satisfactory crystallinity.

The material of the high-concentration p-type semiconductor layer 8 is preferably a gallium nitride-based compound that comprises at least $Al_eGa_{1-e}N$ ($0\leq e<0.5$, preferably $0\leq e\leq 0.2$, and more preferably $0\leq e\leq 0.1$). When the Al composition is within the above range, it is possible to maintain satisfactory crystallinity and also to satisfactorily ohminc-contact with the p-type ohmic electrode. The high-concentration p-type semiconductor layer 8 takes a role of a p-type contact layer.

The thickness of the high-concentration p-type semiconductor layer 8 is preferably controlled within a range of 50 nm or less, more preferably 30 nm or less, and still more preferably 5 nm or more and 20 nm or less.

The high-concentration p-type semiconductor layer 8 is likely to be damaged through etching and, when subjected to concavo-convex processing for improving a light extraction efficiency in the manufacturing process described hereinafter, high-concentration p-type semiconductor layer is damaged to increase a device drive current. For example, it is not preferred that the thickness of the high-concentration p-type semiconductor layer 8 is more than 50 nm since the damaged region of the high-concentration p-type semiconductor layer 8 increases, resulting in high resistance in the manufacturing process described hereinafter. However, by decreasing the thickness of the high-concentration p-type semiconductor layer 8 to 50 nm or less, damage is decreased and thus an increase in the device drive current can be prevented.

Since a diffusion current layer described hereinafter diffuses inside of the high-concentration p-type semiconductor layer 8 by several nm, the thickness of the high-concentration p-type semiconductor layer 8 is preferably controlled to 5 nm or more.

The high-concentration p-type semiconductor layer 8 can be satisfactorily ohmic-contacted with a translucent current diffusion layer 20 as a p-type ohmic electrode, and a current can be easily injected into a p-type semiconductor layer 5 from the translucent current diffusion layer 20. Thereby, a luminous efficiency of this semiconductor light-emitting device can be improved and a driving voltage of this semiconductor light-emitting device can be decreased.

<Low-Concentration p-Type Semiconductor Region 40>

Figure 3:
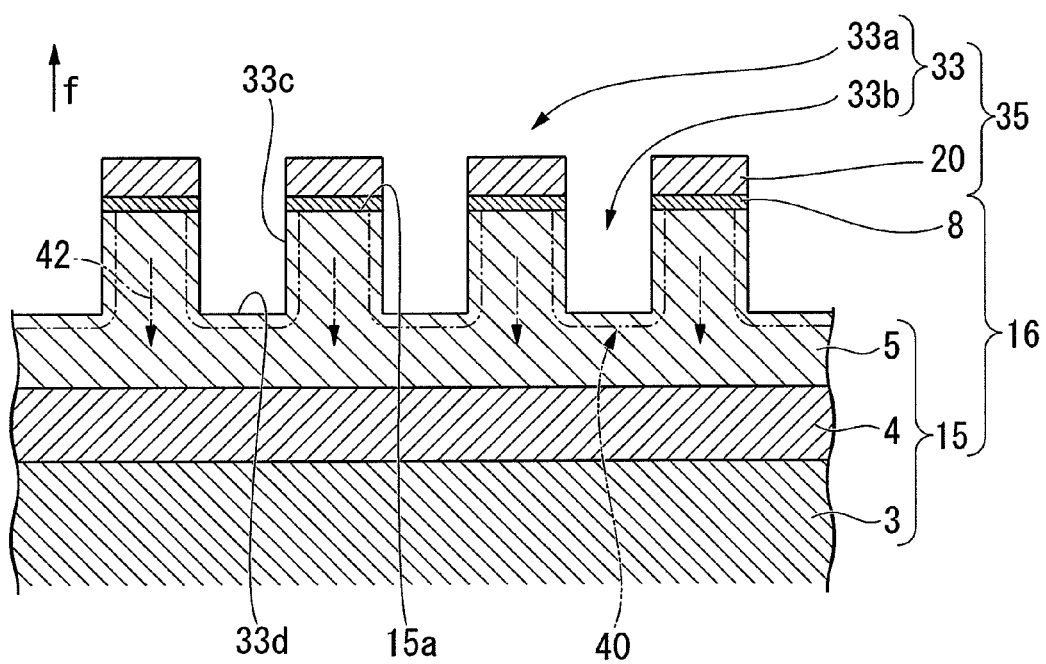
FIG. 3 is an enlarged cross-sectional diagram of a semiconductor light-emitting device as the first embodiment of the present invention.

FIG. 3 is an enlarged cross-sectional diagram of the part B of FIG. 1b. As shown in FIG. 3, a side wall 33c and a bottom 33d of the p-type semiconductor layer 5 are exposed in a concave part 33b formed through etching. A low-concentration p-type semiconductor region 40 having a lower dopant concentration than that of the p-type semiconductor layer 5 is formed in a near region of a side wall 33c and a bottom 33d of the p-type semiconductor layer 5.

The low-concentration p-type semiconductor region 40 is a region that is formed through etching a p-type semiconductor layer 5 with formation of a concavo-convex part 33 thereby vaporizing a p-type dopant such as Mg from the p-type semiconductor layer 5. This is the region where high resistance has been achieved by decreasing the concentration (the concentration of impurities) of the p-type dopant such as Mg.

The dopant concentration of the low-concentration p-type semiconductor region 40 can be controlled by the etching conditions <Translucent Current Diffusion Layer>

As shown in FIG. 1a, a translucent current diffusion layer 20 is laminated on a high-concentration p-type semiconductor layer 8.

It is possible to use, as the material of the translucent current diffusion layer 20, for example, transparent oxides such as $In_2O_3$—$SnO_2$ (ITO), ZnO—$Al_2O_3$ (AZO), $In_2O_3$—ZnO (IZO), ZnO—$GeO_2$ (GZO) and $In_2O_3$—$CeO_2$ (ICO). It is also possible to use, for example, metals such as Au, Ni, Co, Cu, Pd, Pt, Rh, Os, Ir and Ru. Furthermore, the metal may be used in combination with a transparent oxide. For example, the transparent oxide may be contained as a mass in a film made of the metal, or the transparent oxide may be formed into a layer and then the obtained layer and the film made of the metal are laid one upon another. These well-known materials can be used without any limitation and those having any structure including a conventionally known structure can be used without any limitation.

It is possible to use, as the method of forming a translucent current diffusion layer 20, commonly used means well known in this technical field. After forming the translucent current diffusion layer 20, the translucent current diffusion layer may be subjected to thermal annealing for the purpose of alloying and transparency.

<Light Extraction Part>

A semiconductor light-emitting device 11 as the embodiment of the present invention is a face-up (FU) type light-emitting device in which emitted light is taken out from a light extraction part 35 to a front direction f as shown in FIG. 1a.

As shown in FIG. 3, the light extraction part 35 is constituted from a concavo-convex part 33 and a translucent current diffusion layer 20. A part of emitted light from light-emitting layer 4 is extracted to a front direction f through the concavo-convex part 33 of the light extraction part 35. The concavo-convex part 33 can prevent inside reflection of light in the laminate semiconductor layer 15, thereby improving a light extraction efficiency to a front direction f and improving a luminous efficiency of this semiconductor light-emitting device.

<Bonding Pad of Positive Electrode>

A bonding pad 7 of a positive electrode is provided on a translucent current diffusion layer 20, like an example shown in FIG. 1b.

As the bonding pad 7 of the positive electrode, for example, various structures using metals such as Au, Al, Ni and Cu are well known, and those with these well-known structures and materials can be used without any limitation.

The thickness of the bonding pad 7 of the positive electrode is preferably within a range from 100 to 3,000 nm. Since the bonding pad having a larger thickness exhibits higher bondability due to the characteristic of the bonding pad, the thickness of the bonding pad 7 of the positive electrode is more preferably controlled to 300 nm or more. Furthermore, the thickness is preferably controlled to 2,000 nm or less in view of the manufacturing costs.

<Bonding Pad of Negative Electrode>

A bonding pad 6 of a negative electrode is formed so as to contact with an n-type semiconductor layer 3, as shown in FIG. 1b.

Therefore, in case of forming the bonding pad 6 of the negative electrode, a part of a light-emitting layer 4 and a p-type semiconductor layer 5 is removed to expose an n-type contact layer of the n-type semiconductor layer 3, and the bonding pad 6 of the negative electrode is formed thereon.

As the bonding pad 6 of the negative electrode, negative electrodes with various compositions and structures are well known, and these well-known negative electrodes can be used without any limitation and can provided by commonly used means well known in this technical field.

A bonding pad 7 of a positive electrode is formed on a concavo-convex part 33. By converting a bonding surface between the bonding pad 7 and a laminate semiconductor layer 15 into a concavo-convex surface, the bonding pad 7 is adhered onto a top surface 15a of each laminate semiconductor layer 15 with high adhesion.

As shown in FIG. 1a, another concavo-convex part is also formed on a top surface of an n-type semiconductor layer 3 directly under the bonding pad 6 of the negative electrode. Therefore, the bonding pad 6 is also adhered onto the n-type semiconductor layer 3 with high adhesion, similarly.

<Method for Manufacturing Semiconductor Light-Emitting Device>

Next, an example of a method for manufacturing a semiconductor light-emitting device as the embodiment of the present invention will be described with reference to FIG. 4a, FIG. 4b, FIG. 4c, FIG. 5a, FIG. 5b and FIG. 5c.

<First Step>

A first step is a step of laminating a laminate semiconductor layer 15 comprised of an n-type semiconductor layer 3, a light-emitting layer 4 and a p-type semiconductor layer 5, and a high-concentration p-type semiconductor layer 8 on a substrate 1 in this order.

Figure 4A:
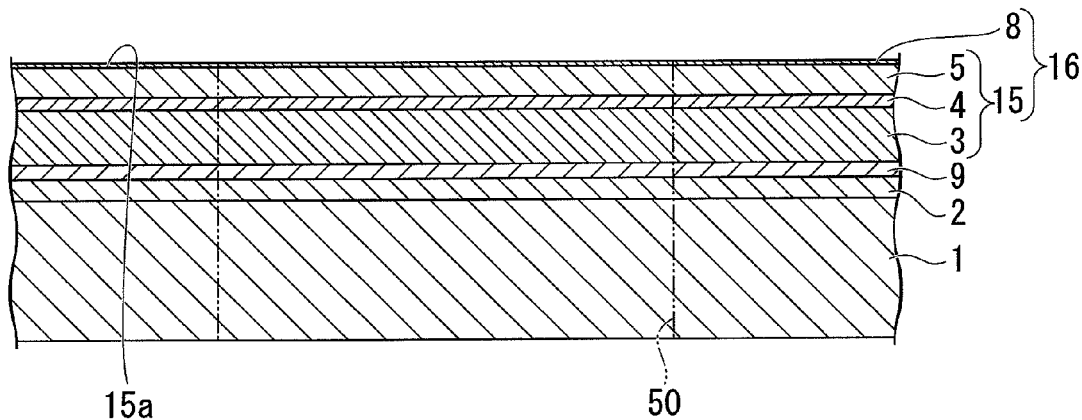
FIG. 4a is a manufacturing process diagram of a semiconductor light-emitting device as the first embodiment of the present invention.

First, using a predetermined film formation method such as a sputtering method, a buffer layer 2 and a ground layer 9 are formed on a substrate 1. Next, using a predetermined film formation method such as a MOCVD method, an n-type semiconductor layer 3, a light-emitting layer 4 and a p-type semiconductor layer 5 are allowed to undergo crystal growth in this order on a ground layer 9 to form a laminate semiconductor layer 15. Next, as shown in FIG. 4a, a high-concentration p-type semiconductor layer 8 is formed on the laminate semiconductor layer 15 to form a laminate 16.

As the material of the n-type semiconductor layer 3, the light-emitting layer 4, the p-type semiconductor layer 5 and the high-concentration p-type semiconductor layer 8, a gallium nitride-based compound is used. As a p-type dopant (p-type impurities) of the p-type semiconductor layer 5 and the high-concentration p-type semiconductor layer 8, for example, Mg or the like is used.

The high-concentration p-type semiconductor layer 8 is formed so that the dopant concentration becomes higher than that of the p-type semiconductor layer 5. The dopant concentration of the p-type semiconductor layer 5 is controlled to $1\times10^{19}/cm^3$ or more and less than $1\times10^{20}/cm^3$, and the dopant concentration of the high-concentration p-type semiconductor layer 8 is controlled to $1\times10^{20}/cm^3$ or more.

<Second Step: Light Extraction Part Formation Step>

A light extraction part formation step is a step of forming a concavo-convex part 33 on all or a part of a top surface 15a of the laminate semiconductor layer 15, and forming a translucent current diffusion layer 20 on at least a convex part 33a that constitutes the concavo-convex part 33.

In the present embodiment, a translucent current diffusion layer 20 is formed, and then at least a part of a p-type semiconductor layer 5 is removed through etching to form a concave part 33b, and the top surface 15a of the laminate semiconductor layer 15 is entirely converted into the concavo-convex part 33.

Figure 4B:
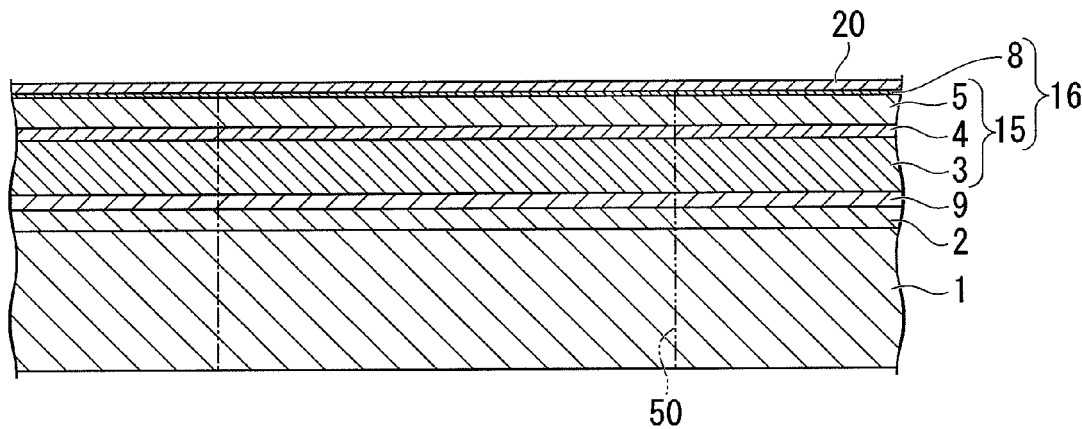
FIG. 4b is a manufacturing process diagram of a semiconductor light-emitting device as the first embodiment of the present invention.

First, as shown in FIG. 4b, the translucent current diffusion layer 20 is formed on the high-concentration p-type semiconductor layer 8.

Figure 4C:
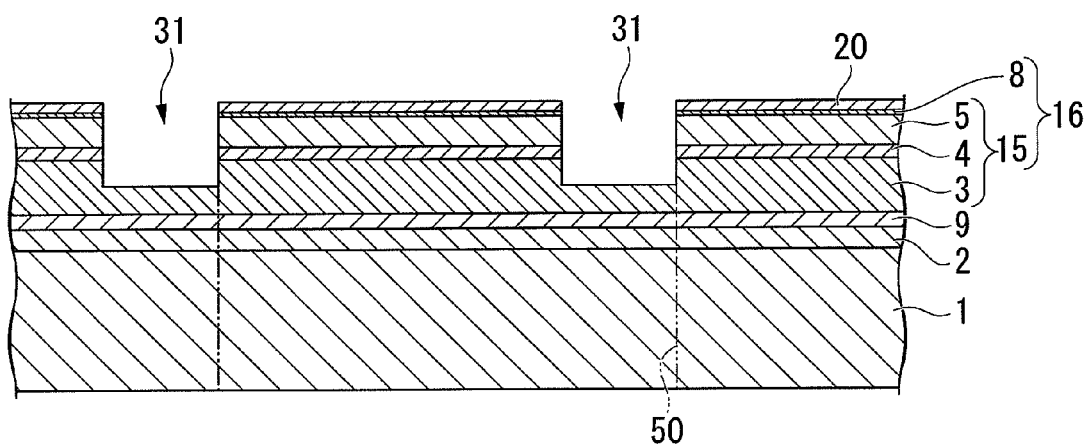
FIG. 4c is a manufacturing process diagram of a semiconductor light-emitting device as the first embodiment of the present invention.

Next, as shown in FIG. 4c, a notch part 31 that passes through the translucent current diffusion layer 20, the high-concentration p-type semiconductor layer 8, a p-type semiconductor layer 5 and a light-emitting layer 4 to expose n-type semiconductor layer 3 is formed through etching.

Figure 5A:
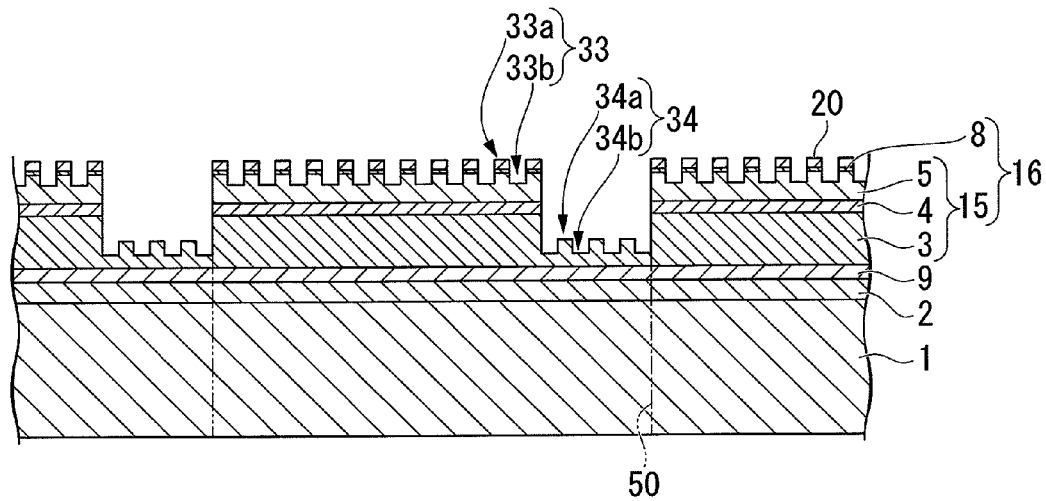
FIG. 5a is a manufacturing process diagram of a semiconductor light-emitting device as the first embodiment of the present invention.

Next, as shown in FIG. 5a, a top surface 15a of a laminate semiconductor layer 15 is etched to form a concave part 33b that reaches the inside of the p-type semiconductor layer 5, thus forming a concavo-convex part 33 comprised of a concave part 33b and a convex part 33a. The concavo-convex part 33 is also formed on a top surface of the n-type semiconductor layer 3 of the notch part 31.

At this time, an etching mask, that protects a non-etched part (a top surface part of a convex part 33a), is formed and then subjected to dry etching to form a concave part 33b.

There is no particular limitation on the etching mask, and a resist, $SiO_2$ and the like can be used. The shape of the opening of the etching mask, such as circle, ellipse, polygon, stripe shape can be selected according to size, shape, emission wavelength and the like of a semiconductor light-emitting device.

It is preferred to use, as the method of forming an etching mask, any one of a nanoimprinting method, an EB exposure method or a laser exposure method.

In the nanoimprinting method, a die embossed with a concavo-convex pattern (etching pattern) is pressed against a wafer coated with a resist material thereby transferring the pattern to form an etching mask.

With the constitution in which the etching pattern is formed in a nano order, an etching mask with a high-resolution etching pattern can be formed. Since this transfer step can be carried out within a short time, productivity can be improved. The etching mask can be manufactured at low costs when compared with a conventional pattern formation technology using lithography and etching.

The electron beam (EB) exposure method or the laser exposure method is one of exposure methods in which pattern transfer is carried out to a resist (a photosensitive resin) and a resolution performance is particularly high. Therefore, an etching mask for a high-resolution etching pattern can be formed. Thereby, a light extraction performance of the concavo-convex part 33 to be formed can be improved.

Next, by introducing into a known dry etching device in a state where the etching mask is attached to a top surface 15a side of a laminate semiconductor layer 15 and performing dry etching, the part corresponding to an opening of the etching mask is etched, and thus a concave part 33b can be formed. Thereby the concavo-convex part 33 can be formed on the top surface 15a of the laminate semiconductor layer 15.

As shown in FIG. 5a, the depth of the concave part 33b is the depth enough to remove at least a part of the p-type semiconductor layer 5 through etching, and to reach the inside of the p-type semiconductor layer 5.

Through etching the p-type semiconductor layer 5, a p-type dopant such as Mg is vaporized from the p-type semiconductor layer 5 in a near region of the side wall 33c and the bottom 33d of the p-type semiconductor layer 5. Thereby, the concentration of the p-type dopant such as Mg (the concentration of impurities) is decreased, thus making it possible to form a region where high resistance has been achieved, that is, a low-concentration p-type semiconductor region 40.

Next, the etching mask is peeled by performing organic solvent cleaning.

Figure 5B:
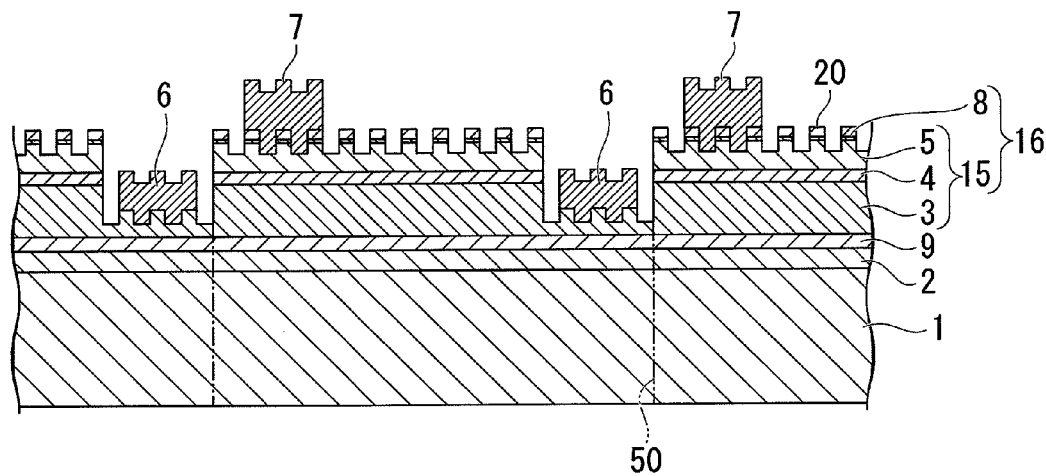
FIG. 5b is a manufacturing process diagram of a semiconductor light-emitting device as the first embodiment of the present invention.

Next, as shown in FIG. 5b, bonding pads 7, 6 are respectively formed on a translucent current diffusion layer 20 and a top surface of an n-type semiconductor layer 3 in a notch part 31.

Figure 5C:
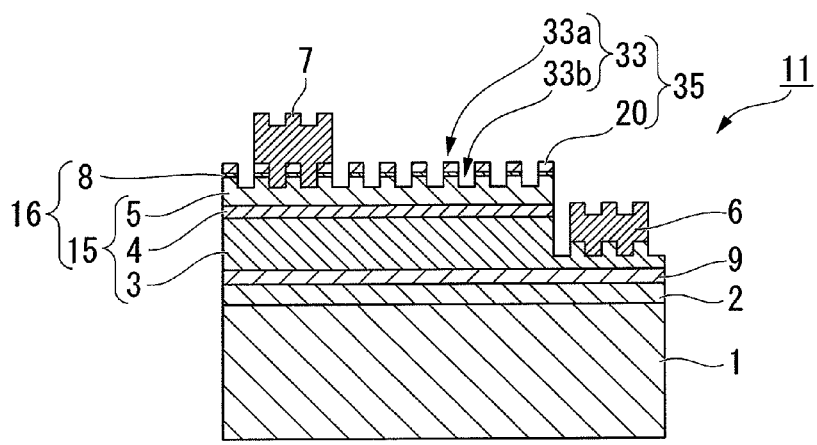
FIG. 5c is a manufacturing process diagram of a semiconductor light-emitting device as the first embodiment of the present invention.

Finally, as shown in FIG. 5c, a semiconductor light-emitting device 11 is manufactured by separating every device along a device separation line 50.

Since a semiconductor light-emitting device 11 as the embodiment of the present invention is constituted by including a laminate semiconductor layer 15 comprised of an n-type semiconductor layer 3, a light-emitting layer 4 and a p-type semiconductor layer 5, and a concavo-convex part 33 for improving a light extraction efficiency, which is formed on all or a part of a top surface 15a of the laminate semiconductor layer 15, it is possible to improve a light extraction efficiency to a front direction f and to improve a luminous efficiency of the semiconductor light-emitting device 11. Thereby, a driving voltage of the semiconductor light-emitting device 11 can be increased.

Since the semiconductor light-emitting device 11 as the embodiment of the present invention is constituted by including a laminate semiconductor layer 15 comprised of an n-type semiconductor layer 3, a light-emitting layer 4 and a p-type semiconductor layer 5, a concavo-convex part 33 for improving a light extraction efficiency, which is formed on all or a part of a top surface 15a of the laminate semiconductor layer 15, a high-concentration p-type semiconductor layer 8 having a higher dopant concentration than that of the p-type semiconductor layer 5, which is laminated on a convex part 33a that constitutes a concavo-convex part 33, and a translucent current diffusion layer 20 laminated on at least the high-concentration p-type semiconductor layer 8, it is possible to easily inject a current into the p-type semiconductor layer 5 from the translucent current diffusion layer 20 by satisfactorily ohmic-contacting the translucent current diffusion layer 20 as a p-type ohmic electrode with the high-concentration p-type semiconductor layer 8. Thereby, a luminous efficiency of this semiconductor light-emitting device can be improved and a driving voltage of this semiconductor light-emitting device can be decreased.

In the semiconductor light-emitting device 11 as the embodiment of the present invention, since the thickness of the high-concentration p-type semiconductor layer is 50 nm or less, it is possible to easily inject a current into the p-type semiconductor layer 5 from the translucent current diffusion layer 20 by satisfactorily ohmic-contacting the translucent current diffusion layer 20 as a p-type ohmic electrode with the high-concentration p-type semiconductor layer 8. Thereby, a luminous efficiency of this semiconductor light-emitting device can be improved and a driving voltage of this semiconductor light-emitting device can be decreased.

Since the method for manufacturing a semiconductor light-emitting device 11 as the embodiment of the present invention includes a step of laminating a laminate semiconductor layer 15 comprised of an n-type semiconductor layer 3, a light-emitting layer 4 and a p-type semiconductor layer 5, and a high-concentration p-type semiconductor layer 8 having a higher dopant concentration than that of a p-type semiconductor layer 5 in this order on a substrate 1; and a light extraction part formation step of forming a concavo-convex part 33 on all or a part of a top surface 15a of a laminate semiconductor layer 15 and forming a translucent current diffusion layer 20 on at least a convex part 33a that constitutes the concavo-convex part 33, it is possible to easily form a light extraction part 35 and to improve a light extraction efficiency and easily, thus easily forming this semiconductor light-emitting device having a decreased driving voltage.

In the method for manufacturing a semiconductor light-emitting device 11 as the embodiment of the present invention, since the light extraction part formation step is a step of forming a translucent current diffusion layer 20 and then removing at least a part of a p-type semiconductor layer 5 through etching to form a concave part 33b, thus converting all or a part of a top surface 15a of a laminate semiconductor layer 15 into concavo-convex part 33, it is possible to easily form a light extraction part 35 and to improve a light extraction efficiency, thus easily forming this semiconductor light-emitting device having a decreased driving voltage.

In the method for manufacturing a semiconductor light-emitting device 11 as the embodiment of the present invention, since the light extraction part formation step is a step of forming a low-concentration p-type semiconductor region 40 having a lower dopant concentration than that of a p-type semiconductor layer 5 on the p-type semiconductor layer 5 in a concave part 33b, it is possible to easily form a low-concentration p-type semiconductor region 40 and to improve a light extraction efficiency, thus easily forming a semiconductor light-emitting device having a decreased driving voltage.

In the method for manufacturing a semiconductor light-emitting device 11 as the embodiment of the present invention, since a concave part 33b is formed through etching so as to reach the inside of a p-type semiconductor layer 5, it is possible to surely form a low-concentration p-type semiconductor region 40 on a p-type semiconductor layer 5 and to improve a light extraction efficiency, thus easily forming a semiconductor light-emitting device having a decreased driving voltage.

In the method for manufacturing a semiconductor light-emitting device 11 as the embodiment of the present invention, since a concave part 33b is formed through a dry etching method, it is possible to surely form a low-concentration p-type semiconductor region 40 on a p-type semiconductor layer 5 and to improve a light extraction efficiency, thus easily forming a semiconductor light-emitting device having a decreased driving voltage.

In the method for manufacturing a semiconductor light-emitting device 11 as the embodiment of the present invention, since an etching mask used in a dry etching method is formed through any one of a nanoimprinting method, an EB exposure method and a laser exposure method, it is possible to make an etching mask with a high-resolution etching pattern and to improve a light extraction performance from a concavo-convex part 33.

Second Embodiment

<Semiconductor Light-Emitting Device>

Figure 6:
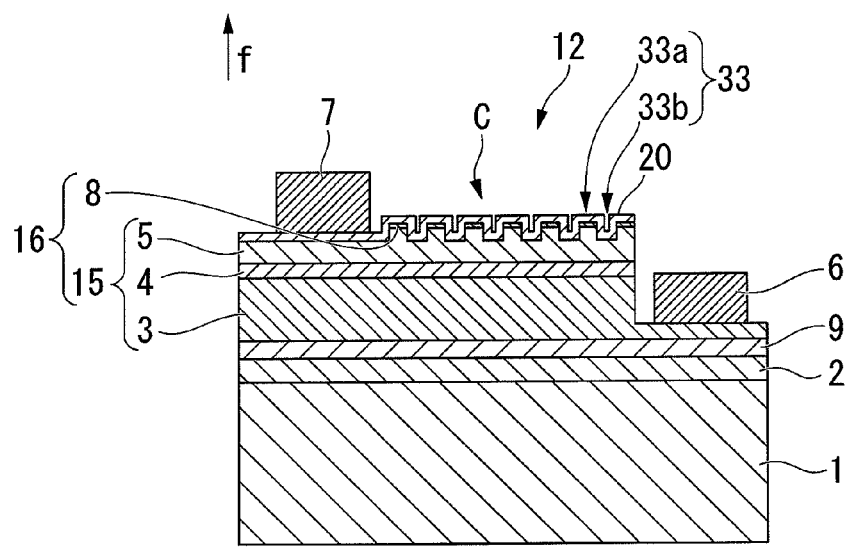
FIG. 6 is a cross-sectional diagram of a semiconductor light-emitting device as the second embodiment of the present invention.

FIG. 6 is a cross-sectional diagram showing an example of a semiconductor light-emitting device as the second embodiment of the present invention.

As shown in FIG. 6, a semiconductor light-emitting device 12 as the embodiment of the present invention has the same constitution as that of the semiconductor light-emitting device 11 shown in the first embodiment, except that a concavo-convex part 33 is formed on a part of a top surface 15a of a laminate semiconductor layer 15 comprised of an n-type semiconductor layer 3, a light-emitting layer 4 and a p-type semiconductor layer 5, and a translucent current diffusion layer 20 is laminated so as to coat the entire surface of a top surface 15a of a high-concentration p-type semiconductor layer 8 and a laminate semiconductor layer 15 formed on a convex part 33a that constitutes a concavo-convex part 33. The same reference sign is used for the same member as that shown in the first embodiment.

As described above, the concavo-convex part 33 for improving a light extraction efficiency may be formed only on the top surface 15a part of the laminate semiconductor layer 15. Since even at a portion of the concavo-convex part 33 is formed, it is possible to improve a light extraction efficiency to a front direction f.

Figure 7:
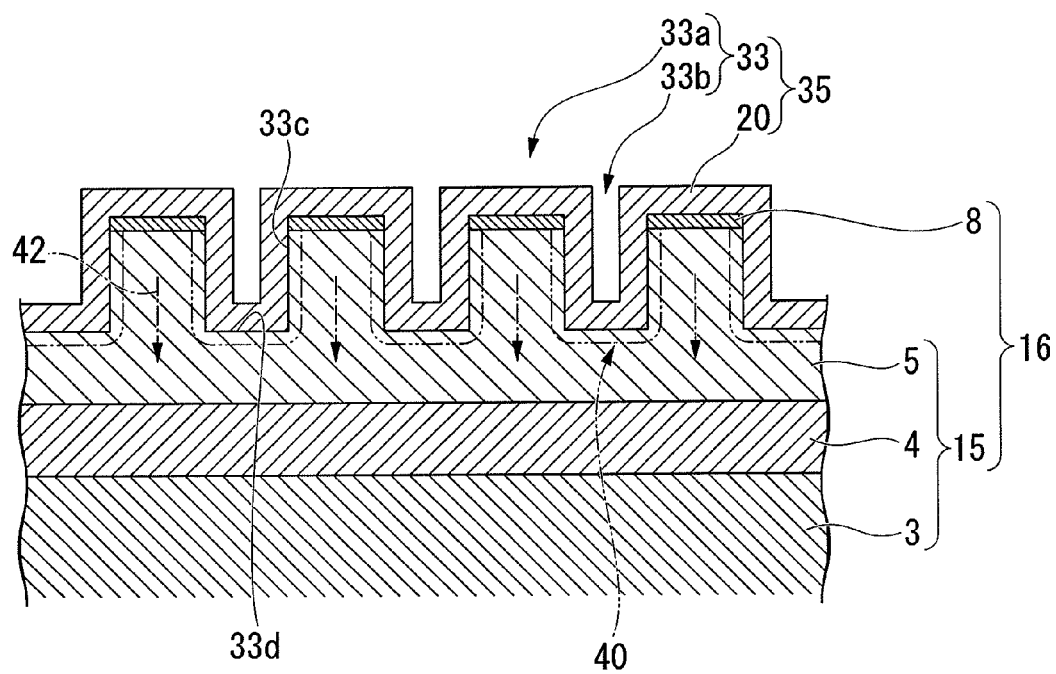
FIG. 7 is an enlarged cross-sectional diagram of a semiconductor light-emitting device as the second embodiment of the present invention.

FIG. 7 is an enlarged cross-sectional diagram of the part C of FIG. 6. As shown in FIG. 7, a concavo-convex part 33 for improving a light extraction efficiency is formed on a top surface 15a of a laminate semiconductor layer 15. A concave part 33b that constitutes a concavo-convex part 33 is formed with a depth enough to reach the inside of a p-type semiconductor layer 5.

In the concave part 33b, a side wall 33c and a bottom 33d of the p-type semiconductor layer 5 are exposed.

In a near region of the side wall 33c and bottom 33d of the p-type semiconductor layer 5, a low-concentration p-type semiconductor region 40 having a lower dopant concentration than that of the p-type semiconductor layer 5 is formed.

The low-concentration p-type semiconductor region 40 is a region that is formed through etching a p-type semiconductor layer 5 with formation of a concavo-convex part 33 thereby vaporizing a p-type dopant such as Mg from the p-type semiconductor layer 5. This is the region where high resistance has been achieved by decreasing the concentration (the concentration of impurities) of the p-type dopant such as Mg.

The concave part 33b has an opening formed of a hole having a circular shape, and a plurality of the concave parts are formed on the entire surface of a top surface 15a of a laminate semiconductor layer 15. At this time, a convex part 33a becomes a top surface 15a part of the laminate semiconductor layer 15 other than the concave part 33b.

The opening of the concave part 33b is not limited to the hole having a circular shape and may be, for example, a hole having a tetragonal shape or a polygonal shape. A top surface of the convex part 33a is preferably a flat surface.

In place of the concave part 33b that has an opening formed of a hole having a circular shape, a plurality of convex parts 33a may be formed in a columnar shape on the entire surface of a top surface 15a of a laminate semiconductor layer 15. The shape of the convex part 33a is not limited to the columnar shape as long as the top surface of the convex part 33a is a flat surface, and may be prismatic, or a generally columnar shape whose cross-sectional shape is trapezoid.

In the present embodiment, although the concavo-convex part 33 is formed only at a part (a central part) of the top surface 15a of the laminate semiconductor layer 15, as viewed planarly, the concavo-convex part 33 may be formed on the entire surface of the top surface 15a of the laminate semiconductor layer 15 similarly to the first embodiment.

As shown in FIG. 7, a high-concentration p-type semiconductor layer 8 is formed between a translucent current diffusion layer 20 and a p-type semiconductor layer 5. Since the high-concentration p-type semiconductor layer 8 is satisfactorily ohmic-contacted with the translucent current diffusion layer 20 as a p-type ohmic electrode, a current can be easily injected into the p-type semiconductor layer 5 from the translucent current diffusion layer 20.

As shown in FIG. 6 and FIG. 7, the translucent current diffusion layer 20 is formed so as to coat the entire surface of the concavo-convex part 33.

Although the translucent current diffusion layer 20 is formed so as to coat the entire surface of the concavo-convex part 33, a low-concentration p-type semiconductor region 40 in which high resistance has been achieved is respectively formed in a near region of a side wall 33c and a bottom 33d of the concave part 33b, and thus a current is scarcely injected into the p-type semiconductor layer 5 from the translucent current diffusion layer 20, a low-concentration p-type semiconductor region 40 being interposed between the p-type semiconductor layer and the translucent current diffusion layer. Therefore, a current can be diffused into the entire surface of the translucent current diffusion layer 20.

In case the low-concentration p-type semiconductor region 40 is not formed, a current easily flows from the translucent current diffusion layer 20 to the light-emitting layer 4 directly under a bonding pad 7 and in the near region and does not spread on the entire surface of the translucent current diffusion layer 20.

<Method for Manufacturing Semiconductor Light-Emitting Device>

Next, another example of a method for manufacturing a semiconductor light-emitting device as the embodiment of the present invention will be described with reference to FIG. 8a, FIG. 8b, FIG. 8c and FIG. 8d.

First, the same first step as in the first embodiment is carried out to form a buffer layer 2, and then an n-type semiconductor layer 3, a light-emitting layer 4 and a p-type semiconductor layer 5 are allowed to undergo crystal growth in this order on a substrate 1 to form a laminate semiconductor layer 15. Thereafter, a high-concentration p-type semiconductor layer 8 is formed on the laminate semiconductor layer 15.

<Second Step: Light Extraction Part Formation Step>

A light extraction part formation step is a step of forming a concavo-convex part 33 on all or a part of a top surface 15a of the laminate semiconductor layer 15, and forming a translucent current diffusion layer 20 on at least a convex part 33a that constitutes the concavo-convex part 33.

In the present embodiment, at least a part of a p-type semiconductor layer 5 is removed through etching to form a concave part 33b and a part of a top surface 15a of a laminate semiconductor layer 15 is converted into a concavo-convex part 33, and then a translucent current diffusion layer 20 is formed.

Figure 8A:
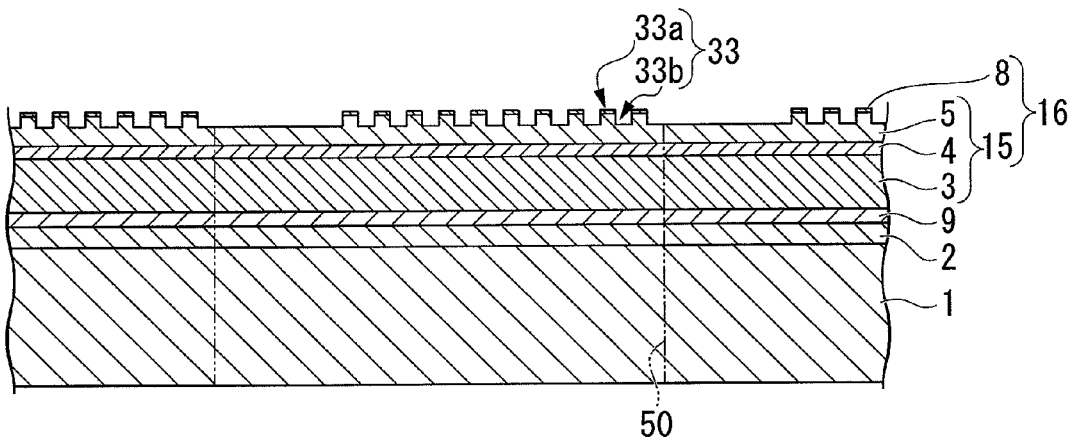
FIG. 8a is a manufacturing process diagram of a semiconductor light-emitting device as the second embodiment of the present invention.

First, as shown in FIG. 8a, a high-concentration p-type semiconductor layer 8 is formed on a top surface 15a of a laminate semiconductor layer 15 to form a laminate 16, and then the laminate 16 is etched to form a concave part 33b having a depth that reaches the inside of the p-type semiconductor layer 5, thus forming a concavo-convex part 33 comprised of a concave part 33b for improving a light extraction efficiency and a convex part 33a.

At this time, similarly to the first embodiment, an etching mask, that protects a non-etched part (a top surface part of a convex part 33a), is formed and then subjected to dry etching using the etching mask to form a concave part 33b. At this time, a part constituting a bonding pad 7 of a positive electrode is etched so as to become a flat surface.

Figure 8B:
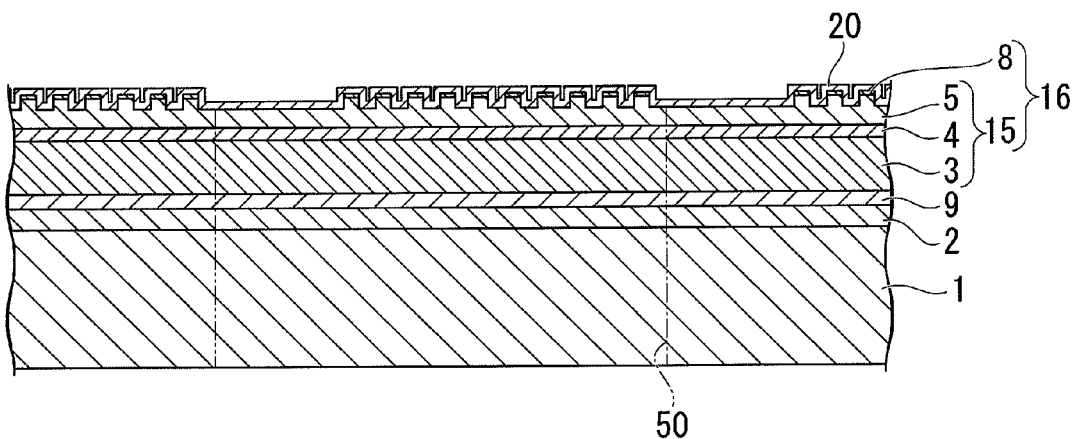
FIG. 8b is a manufacturing process diagram of a semiconductor light-emitting device as the second embodiment of the present invention.

Next, as shown in FIG. 8b, a translucent current diffusion layer 20 is formed so as to coat a top surface 15a of a high-concentration p-type semiconductor layer 8 and a laminate semiconductor layer 15.

Figure 8C:
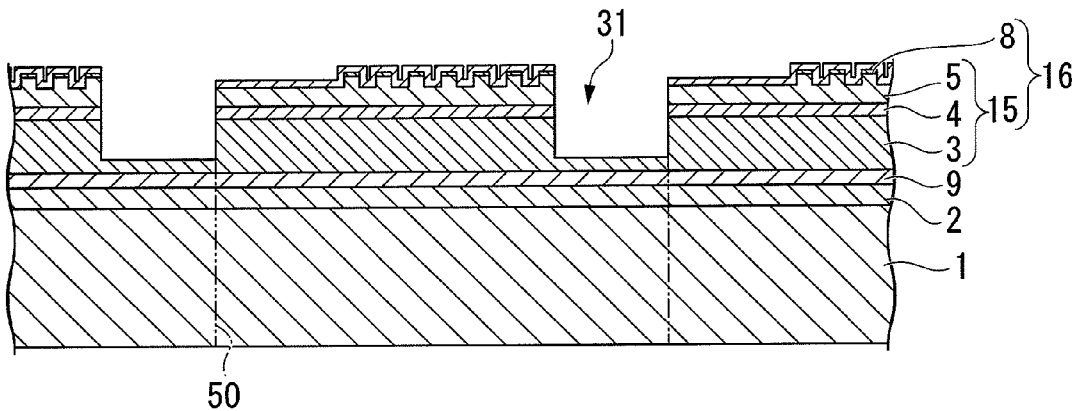
FIG. 8c is a manufacturing process diagram of a semiconductor light-emitting device as the second embodiment of the present invention.

Next, as shown in FIG. 8c, a notch part 31 that passes through the translucent current diffusion layer 20, the high-concentration p-type semiconductor layer 8, a p-type semiconductor layer 5 and a light-emitting layer 4 to expose n-type semiconductor layer 3 is formed through etching.

Next, bonding pads 7, 6 are respectively formed on a translucent current diffusion layer 20 and a top surface of an n-type semiconductor layer 3 in the notch part 31.

Figure 8D:
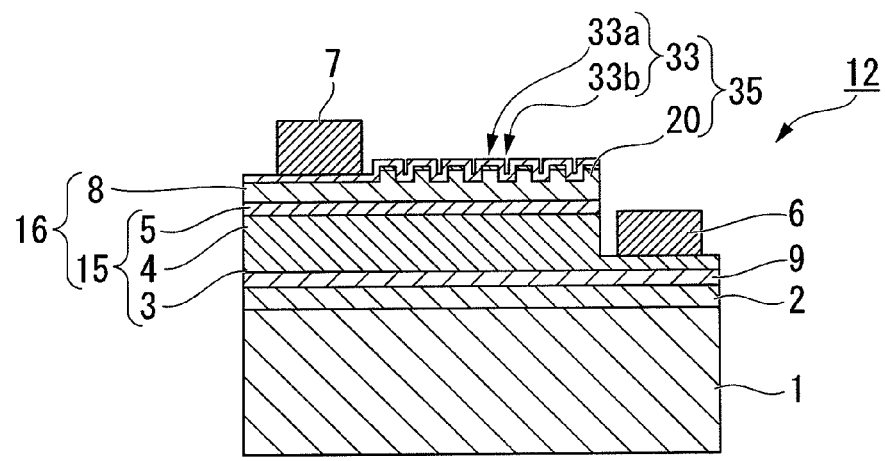
FIG. 8d is a manufacturing process diagram of a semiconductor light-emitting device as the second embodiment of the present invention.

Finally, as shown in FIG. 8d, a semiconductor light-emitting device 12 is manufactured by separating every device along a device separation line 50.

The semiconductor light-emitting device 12 as the second embodiment of the present invention has, in addition to the same effect as in the first embodiment, the following effect.

In a semiconductor light-emitting device 12 as the embodiment of the present invention, since a translucent current diffusion layer 20 is laminated on the entire surface of a concavo-convex part 33, a current can be diffused into the entire surface of the translucent current diffusion layer 20. Thereby, light can be taken out from the entire surface of a light extraction part 35.

In the method for manufacturing a semiconductor light-emitting device 12 as the embodiment of the present invention, since the light extraction part formation step is a step of removing at least a part of a p-type semiconductor layer 5 through etching to form a concave part 33b thereby converting all or a part of a top surface 15a of a laminate semiconductor layer 15 into a concavo-convex part 33, and then forming a translucent current diffusion layer 20, a light extraction part 35 can be easily formed.

In the method for manufacturing a semiconductor light-emitting device 12 as the embodiment of the present invention, since a translucent current diffusion layer 20 is laminated on the entire surface of the concavo-convex part 33, the translucent current diffusion layer 20 can be easily formed.

Third Embodiment

<Semiconductor Light-Emitting Device>

Figure 9:
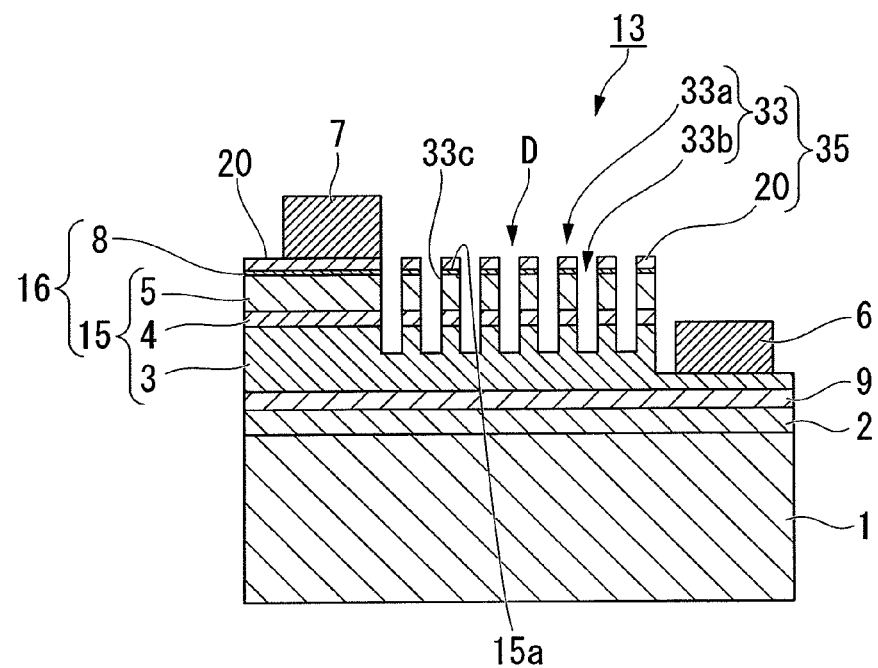
FIG. 9 is a cross-sectional diagram of a semiconductor light-emitting device as the third embodiment of the present invention.

FIG. 9 is a cross-sectional diagram showing an example of a semiconductor light-emitting device as the third embodiment of the present invention.

As shown in FIG. 9, a semiconductor light-emitting device 13 as the embodiment of the present invention has the same constitution as that of the semiconductor light-emitting device 11 shown in the first embodiment, except that a concavo-convex part 33 is formed on a part of a top surface 15a of a laminate semiconductor layer 15, and a concave part 33b is formed with a depth enough to passé through a translucent current diffusion layer 20, a high-concentration p-type semiconductor layer 8, a p-type semiconductor layer 5 and a light-emitting layer 4 to expose an n-type semiconductor layer 3. The same reference sign is used for the same member as that shown in the first embodiment.

Figure 10:
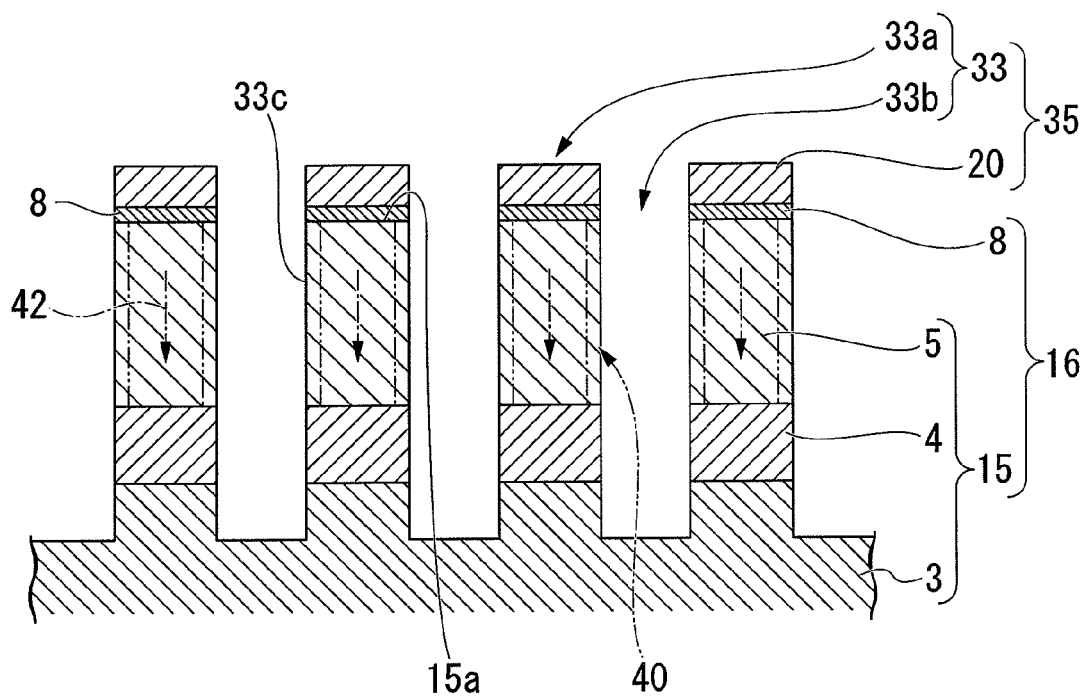
FIG. 10 is an enlarged cross-sectional diagram of a semiconductor light-emitting device as the third embodiment of the present invention.

FIG. 10 is an enlarged cross-sectional diagram of the part D of FIG. 9. As shown in FIG. 10, a concavo-convex part 33 for improving a light extraction efficiency is formed on a top surface 15a of a laminate semiconductor layer 15. A concave part 33b that constitutes the concavo-convex part 33 is formed with a depth enough to pass through a translucent current diffusion layer 20, a high-concentration p-type semiconductor layer 8, a p-type semiconductor layer 5 and a light-emitting layer 4 to reach the inside of an n-type semiconductor layer 3.

In case such a concavo-convex part 33 is formed, it is possible to improve a light extraction efficiency to a front direction f by extracting light taken out from a side face of light-emitting layer 4 to a front direction f.

As shown in FIG. 10, a high-concentration p-type semiconductor layer 8 is formed between a translucent current diffusion layer 20 and a p-type semiconductor layer 5. Since the high-concentration p-type semiconductor layer 8 is satisfactorily ohmic-contacted with a translucent current diffusion layer 20 as a p-type ohmic electrode, a current can be easily injected into the p-type semiconductor layer 5 from the translucent current diffusion layer 20.

Therefore, the current flowing to a light-emitting layer 4 from the translucent current diffusion layer 20 flows while being locally concentrated like the arrow 42 shown in FIG. 10. Thereby, a current can be allowed to efficiently flow from the translucent current diffusion layer 20 to the light-emitting layer 4 without waste, and thus a luminous efficiency of this semiconductor light-emitting device can be improved. Thereby, a driving voltage of this semiconductor light-emitting device can be decreased.

In a concave part 33b, a side wall 33c of a p-type semiconductor layer 5 is exposed. In a near region of the side wall 33c of the p-type semiconductor layer 5, a low-concentration p-type semiconductor region 40 having a lower dopant concentration than that of the p-type semiconductor layer 5 is formed.

The low-concentration p-type semiconductor region 40 is a region that is formed through etching a p-type semiconductor layer 5 with formation of a concavo-convex part 33 thereby vaporizing a p-type dopant such as Mg from the p-type semiconductor layer 5. This is the region where high resistance has been achieved by decreasing the concentration (the concentration of impurities) of the p-type dopant such as Mg.

The concavo-convex part 33b has an opening formed of a hole having a circular shape, and a plurality of the concave parts are formed on the entire surface of a top surface 15a of a laminate semiconductor layer 15. At this time, a convex part 33a becomes a top surface 15a part of the laminate semiconductor layer 15 other than the concave part 33b.

The opening of the concave part 33b is not limited to the hole having a circular shape and may be, for example, a hole having a tetragonal shape or a polygonal shape. A top surface of the convex part 33a is preferably a flat surface.

As shown in FIG. 9 and FIG. 10, high-concentration p-type semiconductor layer 8 is formed between a translucent current diffusion layer 20 and a p-type semiconductor layer 5. Since the high-concentration p-type semiconductor layer 8 is satisfactorily ohmic-contacted with the translucent current diffusion layer 20 as a p-type ohmic electrode, a current can be easily injected into the p-type semiconductor layer 5 from the translucent current diffusion layer 20.

In the concave part 33b, not only a surface of the p-type semiconductor layer 5, but also surfaces of a light-emitting layer 4 and an n-type semiconductor layer 3 are exposed. However, since a low-concentration p-type semiconductor region 40 is formed on a side wall 33c of a p-type semiconductor layer 5, even when garbage or the like enters due to some factors and adheres between the p-type semiconductor layer 5 and the light-emitting layer 4, leak or the like does not arises between the p-type semiconductor layer 5 and the light-emitting layer 4.

<Method for Manufacturing Semiconductor Light-Emitting Device>

Next, an example of a method for manufacturing a semiconductor light-emitting device as the embodiment of the present invention will be described with reference to FIG. 11a, FIG. 11b and FIG. 11c.

First, the same first step as in the first embodiment is carried out to form a buffer layer 2 on a substrate 1, and then an n-type semiconductor layer 3, a light-emitting layer 4 and a p-type semiconductor layer 5 are allowed to undergo crystal growth in this order on a substrate 1 to form a laminate semiconductor layer 15. Thereafter, a high-concentration p-type semiconductor layer 8 is formed on the laminate semiconductor layer 15.

<Second Step: Light Extraction Part Formation Step>

A light extraction part formation step is a step of forming a concavo-convex part 33 on all or a part of a top surface 15a of the laminate semiconductor layer 15, and forming a translucent current diffusion layer 20 on at least a convex part 33a that constitutes the concavo-convex part 33.

In the present embodiment, after forming a translucent current diffusion layer 20, at least a part of a p-type semiconductor layer 5 is removed through etching to form a concave part 33b and a part of a top surface 15a of a laminate semiconductor layer 15 is converted into a concavo-convex part 33.

First, a translucent current diffusion layer 20 is formed on a high-concentration p-type semiconductor layer 8.

Figure 11A:
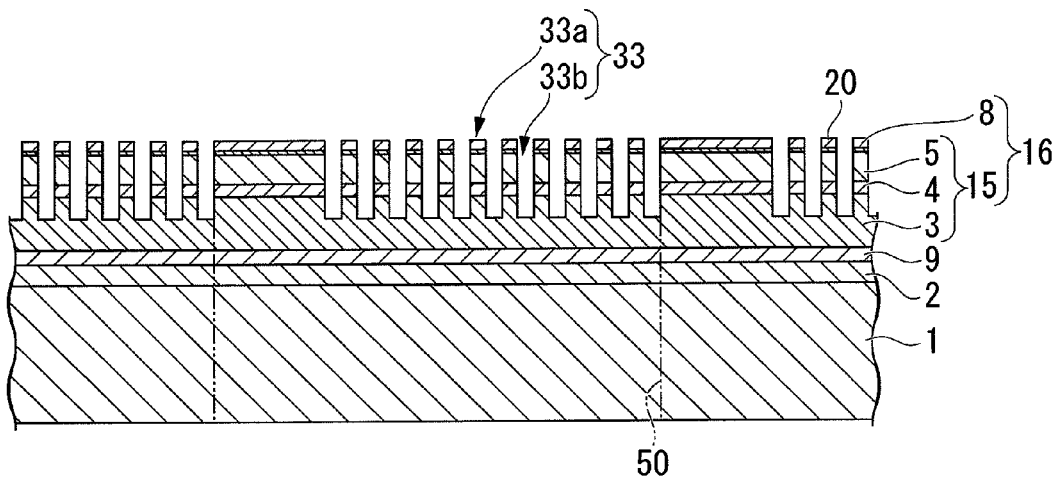
FIG. 11a is a manufacturing process diagram of a semiconductor light-emitting device as the third embodiment of the present invention.

Next, as shown in FIG. 11a, a concave part 33b that passed through a translucent current diffusion layer 20, a high-concentration p-type semiconductor layer 8, a p-type semiconductor layer 5 and a light-emitting layer 4 to expose an n-type semiconductor layer 3 is formed on a top surface 15a of a laminate semiconductor layer 15 through etching to form a concavo-convex part 33.

At this time, the concavo-convex part 33 is not formed in a region where a bonding pad 7 is formed. Similarly to the first embodiment, an etching mask, that protects a non-etched part (a top surface part of a convex part 33a), is formed and then subjected to dry etching using the etching mask to form a concave part 33b.

Figure 11B:
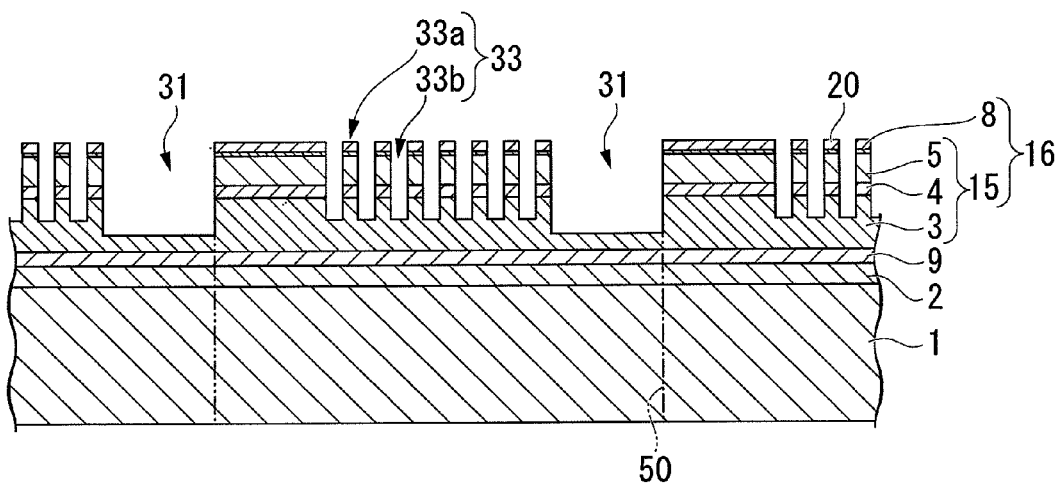
FIG. 11b is a manufacturing process diagram of a semiconductor light-emitting device as the third embodiment of the present invention.

Next, as shown in FIG. 11b, a notch part 31 that passes through a translucent current diffusion layer 20, a high-concentration p-type semiconductor layer 8, a light-emitting layer 4 and a p-type semiconductor layer 5 to expose an n-type semiconductor layer 3 is formed through etching.

Next, bonding pads 7, 6 are respectively formed on the translucent current diffusion layer 20 and a top surface of the n-type semiconductor layer 3 in the notch part 31.

Figure 11C:
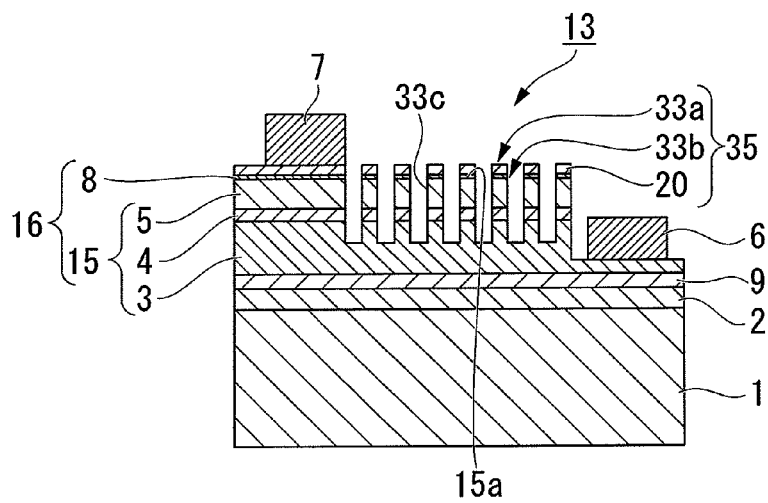
FIG. 11c is a manufacturing process diagram of a semiconductor light-emitting device as the third embodiment of the present invention.

Finally, as shown in FIG. 11c, a semiconductor light-emitting device 13 is manufactured by separating every device along a device separation line 50.

In a semiconductor light-emitting device 13 as the embodiment of the present invention, since a concave part 33b, that constitutes a concavo-convex part 33 of a laminate semiconductor layer 15, passes through a p-type semiconductor layer 5 and a light-emitting layer 4 to reach the inside of an n-type semiconductor layer 3, the light extraction efficiency can be further improved.

Since the semiconductor light-emitting device 13 as the embodiment of the present invention has such a constitution that a low-concentration p-type semiconductor region 40 is formed on a side wall 33c of a p-type semiconductor layer 5, even when garbage or the like enters due to some factors and adheres between the p-type semiconductor layer 5 and the light-emitting layer 4, leak or the like does not arises between the p-type semiconductor layer 5 and the light-emitting layer 4.

In the method for manufacturing a semiconductor light-emitting device 13 as the embodiment of the present invention, since a concave part 33b is formed through etching so that it passes through a p-type semiconductor layer 5 and a light-emitting layer 4 to reach the inside of an n-type semiconductor layer 3, it is possible to surely form a low-concentration p-type semiconductor region 40 on a p-type semiconductor layer 5 and to improve a light extraction efficiency, thus easily forming a semiconductor light-emitting device 13 having a decreased driving voltage.

The present invention will be described specifically by way of Examples. However, the present invention is limited only to these Examples.

EXAMPLES

Example 1

A semiconductor light-emitting device shown in FIG. 1a and FIG. 1b was manufactured in the following manner.

First, using an MOCVD apparatus, an n-type semiconductor layer made of a gallium nitride-based compound, a light-emitting layer and a p-type semiconductor layer were allowed to undergo crystal growth in this order on a substrate to form a laminate semiconductor layer, and then a high-concentration p-type semiconductor layer having a higher dopant concentration than that of the p-type semiconductor layer was formed on the laminate semiconductor layer to form a device substrate with semiconductor layers formed thereon.

Mg was used as a p-type dopant of the p-type semiconductor layer and the high-concentration p-type semiconductor layer, and the dopant concentration was controlled to $5\times10^{19}/cm^3$ and $1\times10^{20}/cm^3$, respectively.

Next, using a sputtering device, a translucent current diffusion layer was formed on the high-concentration p-type semiconductor layer of the device substrate with semiconductor layers formed thereon.

Next, the device substrate with the translucent current diffusion layer formed thereon was put in a dry etching device and a part of a top surface of the laminate semiconductor layer was etched until the n-type semiconductor layer is exposed to form a notch part.

Next, an etching mask was formed on a top surface of the laminate semiconductor layer of the device substrate taken out from the dry etching device using a nanoimprinting method, and then this device substrate was put in the dry etching device again and the top surface of the laminate semiconductor layer was etched to form a concave part, thus forming a concavo-convex part for improving a light extraction efficiency. At this time, the p-type semiconductor layer in the concave part, that constitutes the concavo-convex part of the laminate semiconductor layer, was formed with a low-concentration p-type semiconductor region having a lower dopant concentration than that of the p-type semiconductor layer. The dopant concentration of the low-concentration p-type semiconductor region was less than $1\times10^{19}/cm^3$.

Finally, a bonding pad of a positive electrode was formed on the translucent current diffusion layer and a bonding pad of a negative electrode was formed on the n-type semiconductor layer, and then a semiconductor light-emitting device of Example 1 was formed by separating at a device separation line. Thereafter, current-voltage-luminance characteristic of this semiconductor light-emitting device was measured.

Comparative Example 1

In the same manner as in Example 1, except that the dopant concentration of the high-concentration p-type semiconductor layer was changed to $5\times10^{19}/cm^3$, a semiconductor light-emitting device of Comparative Example 1 was manufactured. Thereafter, current-voltage-luminance characteristic of this semiconductor light-emitting device was measured.

Comparative Example 2

In the same manner as in Example 1, except that the dopant concentration of the high-concentration p-type semiconductor layer was changed to $1\times10^{20}/cm^3$, a semiconductor light-emitting device of Comparative Example 2 was manufactured. Thereafter, current-voltage-luminance characteristic of this semiconductor light-emitting device was measured.

Comparative Example 3

In the same manner as in Example 1, except that the concavo-convex part was not formed and the dopant concentration of the p-type semiconductor layer was changed to $1\times10^{20}/cm^3$, a semiconductor light-emitting device of Comparative Example 3 was manufactured. Thereafter, a current-voltage-luminance characteristic of this semiconductor light-emitting device was measured.

The manufacturing conditions and measurement results of Example 1 and Comparative Examples 1 to 3 are summarized in Table 1.

TABLE 1

| | Concavo-convex part | Dopant concentration of p-type semiconductor layer (cm$^{-3}$) | Dopant concentration of high-concentration p-type semiconductor layer (cm$^{-3}$) | Plane light intensity (arbitrary value) | Vf (V)* |
|---|---|---|---|---|---|
| Example 1 | Formed | $5\times10^{19}$ | $1\times10^{20}$ | 500 | 3.3 |
| Comparative Example 1 | Formed | $5\times10^{19}$ | $5\times10^{19}$ | 500 | 3.6 |
| Comparative Example 2 | Formed | $1\times10^{20}$ | $1\times10^{20}$ | 200 | 5 |
| Comparative Example 3 | Not formed | $1\times10^{20}$ | $1\times10^{20}$ | 300 | 3.2 |

*at I = 20 mA

INDUSTRIAL APPLICABILITY

The semiconductor light-emitting device of the present invention is excellent in light extraction efficiency and is also operable at a low driving voltage. The semiconductor light-emitting device can be applied in the industry that manufactures and utilizes light emitting devices such as various lighting systems and display devices.

REFERENCE SIGNS LIST

1: Substrate
2: Buffer layer
3: n-type semiconductor layer
4: Light-emitting layer
5: p-type semiconductor layer
6: Bonding pad 7: Bonding pad (positive electrode)
8: High-concentration p-type semiconductor layer
9: Ground layer
11, 12, 13: Semiconductor light-emitting devices
15: Laminate semiconductor layer
15a: Top surface
16: Laminate
20: Translucent current diffusion layer
31: Notch part
33: Concavo-convex part
33a: Convex part
33b: Concave part
33c: Side wall
33d: Bottom
35: Light extraction part
40: Low-concentration p-type semiconductor region
50: Device separation line

The invention claimed is:

1. A semiconductor light-emitting device comprising:
a substrate;
a laminate semiconductor layer comprised of an n-type semiconductor layer formed on the substrate, a light-emitting layer laminated on the n-type semiconductor layer and a p-type semiconductor layer laminated on the light-emitting layer;
a concavo-convex part for improving a light extraction efficiency, which is formed on all or a part of a top surface of the laminate semiconductor layer;
a high-concentration p-type semiconductor layer having a higher dopant concentration than that of the p-type semiconductor layer, which is laminated on a convex part that constitutes the concavo-convex part of the laminate semiconductor layer; and
a translucent current diffusion layer laminated on at least the high-concentration p-type semiconductor layer, wherein
the thickness of the high-concentration p-type semiconductor layer is 5 nm or more and 30 nm or less,
the dopant concentration of the p-type semiconductor layer is $1\times10^{19}/cm^3$ or more and less than $1\times10^{20}/cm^3$,
the dopant concentration of the high-concentration p-type semiconductor layer is $1\times10^{20}/cm^3$ or more,
a concave part, that constitutes the concavo-convex part of the laminate semiconductor layer, reaches the inside of the p-type semiconductor layer, and
the p-type semiconductor layer in the concave part is formed with a low-concentration p-type semiconductor region having a lower dopant concentration than that of the p-type semiconductor layer.

2. The semiconductor light-emitting device according to claim 1, wherein the translucent current diffusion layer is laminated on the entire surface of the concavo-convex part.

3. A semiconductor light-emitting device comprising:
a substrate;
a laminate semiconductor layer comprised of an n-type semiconductor layer formed on the substrate, a light-emitting layer laminated on the n-type semiconductor layer and a p-type semiconductor layer laminated on the light-emitting layer;
a concavo-convex part for improving a light extraction efficiency, which is formed on all or a part of a top surface of the laminate semiconductor layer;
a high-concentration p-type semiconductor layer having a higher dopant concentration than that of the p-type semiconductor layer, which is laminated on a convex part that constitutes the concavo-convex part of the laminate semiconductor layer; and
a translucent current diffusion layer laminated on at least the high-concentration p-type semiconductor layer, wherein
the thickness of the high-concentration p-type semiconductor layer is 5 nm or more and 30 nm or less,
the dopant concentration of the p-type semiconductor layer is $1\times10^{19}/cm^3$ or more and less than $1\times10^{20}/cm^3$,
the dopant concentration of the high-concentration p-type semiconductor layer is $1\times10^{20}/cm^3$ or more,
a concave part, that constitutes the concavo-convex part of the laminate semiconductor layer, passes through the p-type semiconductor layer and the light-emitting layer to reach the inside of the n-type semiconductor layer, and
the p-type semiconductor layer in the concave part is formed with a low-concentration p-type semiconductor region having a lower dopant concentration than that of the p-type semiconductor layer.

4. The semiconductor light-emitting device according to claim 1, wherein the p-type semiconductor layer, the high-concentration p-type semiconductor layer and the low-concentration p-type semiconductor region are constituted from a gallium nitride-based semiconductor, and a dopant contained therein is Mg, and
the dopant concentration of the low-concentration p-type semiconductor region is less than $1\times10^{19}/cm^3$.

5. The semiconductor light-emitting device according to claim 3, wherein the p-type semiconductor layer, the high-concentration p-type semiconductor layer and the low-concentration p-type semiconductor region are constituted from a gallium nitride-based semiconductor, and a dopant contained therein is Mg, and
the dopant concentration of the low-concentration p-type semiconductor region is less than $1\times10^{19}/cm^3$.

6. The semiconductor light-emitting device according to claim 3, wherein the translucent current diffusion layer is laminated on the entire surface of the concavo-convex part.

* * * * *